(12) United States Patent
Takeda et al.

(10) Patent No.: US 6,509,671 B2
(45) Date of Patent: Jan. 21, 2003

(54) DRIVING METHOD AND DRIVING CIRCUIT FOR PIEZOELECTRIC TRANSFORMER, COLD CATHODE TUBE EMISSION DEVICE, LIQUID CRYSTAL PANEL AND LIQUID CRYSTAL PANEL BUILT-IN APPARATUS

(75) Inventors: Katsu Takeda, Osaka (JP); Hiroshi Nakatsuka, Osaka (JP); Katsunori Moritoki, Osaka (JP); Takeshi Yamaguchi, Kanagawa (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/870,979

(22) Filed: May 31, 2001

(65) Prior Publication Data

US 2001/0050513 A1 Dec. 13, 2001

(30) Foreign Application Priority Data

Jun. 5, 2000 (JP) ....................................... 2000-167245

(51) Int. Cl.⁷ ............................................. H01L 41/08
(52) U.S. Cl. .............................. 310/316.01; 315/209 PZ
(58) Field of Search ............................ 310/316.01, 317, 310/319; 315/209 PZ, 209 R

(56) References Cited

U.S. PATENT DOCUMENTS

| 5,654,605 A | * | 8/1997 | Kawashima | ............ 310/316.01 |
| 5,886,477 A | * | 3/1999 | Honbo et al. | ......... 315/209 PZ |
| 5,894,184 A | * | 4/1999 | Furuhashi et al. | ..... 310/316.01 |
| 6,184,631 B1 | * | 2/2001 | Noma et al. | ................ 315/224 |
| 6,285,136 B1 | * | 9/2001 | Fujii et al. | ............ 315/209 PZ |

FOREIGN PATENT DOCUMENTS

JP          6-167694        6/1994

* cited by examiner

Primary Examiner—Mark O. Budd
(74) Attorney, Agent, or Firm—Merchant & Gould P.C.

(57) ABSTRACT

A driving method and a driving circuit for a piezoelectric transformer are capable of driving the piezoelectric transformer with high driving efficiency independently of an impedance change of a load such as a cold cathode tube by corresponding to the characteristic variance of the piezoelectric transformer, thereby also suppressing mechanical damage to be imposed on the piezoelectric transformer itself even if the load changes abruptly. The piezoelectric transformer is driven with a predetermined first frequency, and a power supply for a load connected to the secondary side of the piezoelectric transformer is started, and when an impedance of a load changes and reaches a predetermined impedance during the power supply, the driving frequency of the piezoelectric transformer is changed without a sweep from the first frequency to a predetermined second frequency. Furthermore, the second frequency is determined by detecting characteristics of the piezoelectric transformer before supplying the load steadily with electric power.

50 Claims, 9 Drawing Sheets

DRIVING METHOD AND DRIVING CIRCUIT FOR PIEZOELECTRIC TRANSFORMER, COLD CATHODE TUBE EMISSION DEVICE, LIQUID CRYSTAL PANEL AND LIQUID CRYSTAL PANEL BUILT-IN APPARATUS

BACKGROUND OF THE INVENTION

1. Field of the Invention

The present invention relates to a driving method and a driving circuit for a piezoelectric transformer, a cold cathode tube emission device using a cold cathode tube as a load for a piezoelectric transformer, a liquid crystal panel whose luminance is controlled by the cold cathode tube emission device incorporated therein and an apparatus provided with the liquid crystal panel such as a mobile telephone, a communication terminal etc.

2. Description of the Related Art

In the following, a driving circuit using a conventional piezoelectric transformer will be explained.

Generally in a piezoelectric transformer, due to the impedance of a load connected to the secondary side, a voltage step-up ratio indicating a voltage to be output to the secondary side relative to a voltage entering the primary side is changed, and the driving efficiency, shown by the electric power sent to the secondary side relative to the electric power entering the primary side, also is changed, so that a driving frequency for obtaining a maximum voltage step-up ratio and maximum driving efficiency also is changed. In other words, in order to drive a piezoelectric transformer efficiently at a predetermined voltage step-up ratio, the driving frequency must be set according to the impedance of the load to be connected.

For example, in the case of using a cold cathode tube as a load for a piezoelectric transformer, since a cold cathode tube generally shows a high impedance of not less than several hundreds of M Ω until it starts to light and an abrupt impedance decrease from several hundreds of Ω to several tens of Ω after lighting, in order to light the cold cathode tube efficiently by using the piezoelectric transformer, the frequency and the voltage level of an AC voltage applied to the primary side of the piezoelectric transformer should be changed before and after lighting.

As a conventional technique to achieve this purpose, cold cathode tube driving devices disclosed in JP 6(1994)-167694A and others are known, and FIG. 6 shows a block diagram of a driving device disclosed in this publication.

In FIG. 6, an output signal from a free-running multivibrator 106 is amplified by a current amplification circuit 107, and the output signal whose voltage is stepped up further by a wire-wound transformer 108, if necessary, is applied to the primary side of a piezoelectric transformer 101. A cold cathode tube 102 is connected as a load to the secondary side output of the piezoelectric transformer 101, and an electric current flowing in the cold cathode tube 102 is detected by a load current detection circuit 109. The detected current level is converted into a voltage and is input to one of the input terminals of an integration circuit 104 via an AC voltage rectification circuit 110. To the other input terminal, a signal from a variable voltage device 103 is supplied, so that an oscillating frequency of the free-running multivibrator 106 is controlled from the integration circuit 104 via a voltage level shift circuit 105.

In order to light the cold cathode tube 102 serving as the load of the piezoelectric transformer 101, the voltage applied to the piezoelectric transformer 101 is set by the variable voltage device 103 and the voltage level shift circuit 105 etc., and a driving frequency of the piezoelectric transformer 101 is swept so as to light the cold cathode tube 102. After lighting, the driving frequency of the piezoelectric transformer 101 is swept further, and furthermore, according to the current level detected by the load current detection circuit 109 etc., the voltage applied to the piezoelectric transformer 101 is controlled by the variable voltage device 103 and the voltage level shift circuit 105 etc., so that the emission luminance of the cold cathode tube 102 is adjusted.

When a load with a variable impedance such as a cold cathode tube is connected to a piezoelectric transformer, according to a conventional driving method, before the cold cathode tube starts to light, an AC voltage having a large amplitude corresponding to the load in a high impedance state is applied to the secondary side of the piezoelectric transformer at a frequency that is higher than a resonance frequency in an open state. The impedance of the cold cathode tube is reduced according to a change in the lighting state, and the flowing electric current is increased. The cold cathode tube can be lit steadily by detecting this electric current flowing in the cold cathode tube and sweeping the frequency to its low frequency side, and also by changing the amplitude of the applied voltage to become smaller. As a result, there is a problem that the piezoelectric transformer must be driven in the state of low driving efficiency.

Furthermore, corresponding to the high impedance of the cold cathode tube before it starts to light, a high voltage is applied to the piezoelectric transformer. However, corresponding to the reduction of the impedance due to the lighting of the cold cathode tube, a control operation to reduce the applied voltage is performed, so that there is a possibility of momentarily applying a high voltage to the cold cathode tube in a low impedance state. At this time, a strong distortion occurs in the piezoelectric transformer due to a large electric current flowing in the piezoelectric transformer. In particular, when the electric power per volume of the piezoelectric transformer is large, the distortion effected on the piezoelectric transformer may destroy the piezoelectric transformer itself or cause mechanical damage leading to the destruction.

Furthermore, a piezoelectric transformer has a characteristic variance arising from the shape or the material property etc. with respect to frequency characteristics of impedance or an admittance seen from the primary side, or a resonance frequency etc. FIG. 7 is a graph showing the relationship of a voltage step-up ratio and driving efficiency relative to a driving frequency of a piezoelectric transformer. In FIG. 7, the horizontal axis shows driving frequency of the piezoelectric transformer, and the vertical axis on the left side shows a voltage step-up ratio indicating a ratio of a voltage output from the secondary side relative to the voltage applied to the primary side of the piezoelectric transformer, and furthermore, the vertical axis on the right side shows driving efficiency, indicating a ratio of electric power output from the secondary side relative to the electric power applied to the primary side of the piezoelectric transformer. FIG. 7 shows that the voltage step-up ratio and the frequency efficiency of the piezoelectric transformer are variable within a certain form tolerance.

In the case where frequency characteristics of the voltage step-up ratio or the driving efficiency relative to the driving frequency are different as shown in FIG. 7, for example, a piezoelectric transformer achieving a voltage step-up ratio of a maximum value $\gamma_{max}$ with a driving frequency $f_{\gamma 2}$ can be driven with maximum driving efficiency $\eta_{max}$ by driving at a frequency $f_{\eta2}$. However, when it is driven at a frequency $f_{\eta1}$ or a frequency $f_{\eta3}$, the driving efficiency becomes lower than $\eta_{max}$.

In this way, due to the characteristic variance arising from the shape or the material property etc. of the piezoelectric transformer, there is a problem that the piezoelectric transformer cannot be driven with the maximum driving efficiency only by using the driving frequency or the driving voltage predetermined by the driving circuit.

Furthermore, when a liquid crystal panel with a built-in cold cathode tube driving device is incorporated into an apparatus such as a mobile telephone or communication equipment etc., a sweep of the driving frequency becomes a problem. In other words, when a sweep of the driving frequency is performed before starting to light over to the lighting state not continuously but switching the frequency discretely, higher harmonics arise at the switching point of the frequency, which leads to noise that affects the operation of the apparatus. Furthermore, due to the sweep of the driving frequency, a cross modulation may be generated in the carrier frequency of the communication equipment, so that there is fear that the communication cannot be carried out normally.

SUMMARY OF THE INVENTION

The present invention is conceived in light of the aforementioned problems, and its object is to provide a driving method and a driving circuit for a piezoelectric transformer capable of driving the piezoelectric transformer with high driving efficiency independently of an impedance change of a load such as a cold cathode tube by corresponding to the characteristic variance of the piezoelectric transformer, thereby also suppressing mechanical damage that might be imposed on the piezoelectric transformer itself even if the load changes abruptly.

It is another object of the present invention to provide a cold cathode tube emission device that controls the emission of a cold cathode tube by the driving circuit of the piezoelectric transformer, a liquid crystal panel provided with this cold cathode tube emission device, and an apparatus provided with this liquid crystal panel such as a mobile telephone, a communication terminal etc.

To achieve the above object, a first method for driving a piezoelectric transformer according to the present invention is a method for driving a piezoelectric transformer having a primary side electrode and a secondary side electrode formed on a piezoelectric element, in which an AC voltage entering from the primary side electrode is converted and output from the secondary side electrode. The method is characterized by the steps of driving the piezoelectric transformer with a predetermined first frequency, starting a power supply for a load connected to the secondary side of the piezoelectric transformer, and when an impedance of the load changes and reaches a predetermined impedance during the power supply, changing the driving frequency of the piezoelectric transformer from the first frequency without a sweep to a predetermined second frequency and driving the piezoelectric transformer.

To achieve the above object, a second method for driving a piezoelectric transformer according to the present invention is a method for driving a piezoelectric transformer having a primary side electrode and a secondary side electrode formed on a piezoelectric element, in which an AC voltage entering from the primary side electrode is converted and output from the secondary side electrode. The method is characterized by the steps of, before supplying a first electric power steadily to a load connected to the piezoelectric transformer, supplying the load with a second electric power that is sufficiently smaller than the first electric power to detect characteristics of the piezoelectric transformer, and setting a driving frequency of the piezoelectric transformer for the time when the first electric power is supplied steadily.

In the second driving method, the load changes from a high impedance state to a low impedance state according to an increase in the amount of electricity to be supplied, and the first electric power has a level needed to change the load to be in a low impedance state, and the second electric power has only a level to keep the load in a high impedance state.

Furthermore, in the second driving method, it is preferable to drive the piezoelectric transformer with a first frequency when starting the power supply for the load, and to drive the piezoelectric transformer by changing the driving frequency without a frequency sweep to a second frequency when supplying the load steadily with electric power.

To achieve the above object, a third method for driving a piezoelectric transformer according to the present invention is a method for driving a piezoelectric transformer having a primary side electrode and a secondary side electrode formed on a piezoelectric element, in which an AC voltage entering from the primary side electrode is converted and output from the secondary side electrode. The method is characterized by the steps of classifying the piezoelectric transformer in advance by a certain characteristic parameter, determining a second frequency by assuming characteristics of the piezoelectric transformer based on the result of driving the piezoelectric transformer with a predetermined first frequency and on the result of classification by the characteristic parameter, starting a power supply for a load connected to the secondary side of the piezoelectric transformer, and when an impedance of the load changes and reaches a predetermined impedance during the power supply, changing the driving frequency of the piezoelectric transformer from the first frequency without a sweep to the second frequency and driving the piezoelectric transformer.

In the third driving method, it is preferable to classify the piezoelectric transformer by the certain characteristic parameter and also to classify the load by the same characteristic parameter or another characteristic parameter, and to determine the second frequency based on the result of classifying the piezoelectric transformer and the result of classifying the load.

In the first, second and third driving methods, a cold cathode tube is used as the load.

Furthermore, in the first, second and third driving methods, it is preferable to perform the driving control of the piezoelectric transformer by using a microcomputer and its peripheral equipment.

To achieve the above object, a first driving circuit of a piezoelectric transformer according to the present invention includes at least a piezoelectric transformer having a primary side electrode and a secondary side electrode formed on a piezoelectric element, in which an AC voltage entering from the primary side electrode is converted and output from the secondary side electrode, a load output detection part for detecting that an impedance of a load connected to the secondary side of the piezoelectric transformer reaches a predetermined value, and a control part for setting a driving frequency of the piezoelectric transformer as a first frequency when starting a power supply for the load and changing the driving frequency from the first frequency to a second frequency without a sweep according to the result of detection by the load output detection part.

To achieve the above object, a second driving circuit of a piezoelectric transformer according to the present invention includes at least a piezoelectric transformer having a primary side electrode and a secondary side electrode formed on a piezoelectric element, in which an AC voltage entering from the primary side electrode is converted and output from the secondary side electrode, a load output detection part for detecting that an impedance of a load connected to the secondary side of the piezoelectric transformer reaches a predetermined value, a transformer characteristic detection part for detecting characteristics of the piezoelectric transformer, and a control part for performing a driving control of the piezoelectric transformer with a second electric power that is sufficiently smaller than a first electric power before supplying the load steadily with the first electric power, and based on the characteristics of the piezoelectric transformer detected by the transformer characteristic detection part, performing a setting control of a driving frequency of the piezoelectric transformer according to the result of detection by the load output detection part when the first electric power is supplied steadily.

In the second driving circuit, the load changes from a high impedance state to a low impedance state according to an increase in the amount of electricity to be supplied, and the first electric power has a level needed to change the load to be in a low impedance state, and the second electric power has only a level to keep the load in a high impedance state.

Furthermore, in the second driving circuit, it is preferable that the control part performs the driving control of the piezoelectric transformer with a first frequency when starting a power supply for the load and performs the driving control of the piezoelectric transformer by changing the driving frequency without a sweep to a second frequency according to the result of detection by the load output detection part when supplying the load steadily with electric power.

To achieve the above object, a third driving circuit of a piezoelectric transformer according to the present invention includes at least a piezoelectric transformer having a primary side electrode and a secondary side electrode formed on a piezoelectric element, in which an AC voltage entering from the primary side electrode is converted and output from the secondary side electrode, a load output detection part for detecting that an impedance of a load connected to the secondary side of the piezoelectric transformer reaches a predetermined value, a transformer characteristic detection part for detecting characteristics of the piezoelectric transformer, and a control part for determining a second frequency by assuming characteristics of the piezoelectric transformer classified in advance by a certain characteristic parameter, based on the result of classification by the characteristic parameter and the result of detection by the transformer characteristic detection part at the time when the piezoelectric transformer is driven with a predetermined first frequency, and setting a driving frequency of the piezoelectric transformer as the first frequency when starting a power supply for the load and changing the driving frequency from the first frequency to the second frequency without a sweep according to the result of detection by the load output detection part.

In the third driving circuit, it is preferable that the load is classified by the characteristic parameter or another characteristic parameter, and that the control part determines the second frequency based on the results of classifying the piezoelectric transformer and the load.

In the first, second, and third driving circuits, a cold cathode tube is used as the load.

Furthermore, in the first, second and third driving circuits, it is preferable that the control part includes a microcomputer and its peripheral equipment.

To achieve the above object, a first cold cathode tube emission device according to the present invention includes at least a piezoelectric transformer having a primary side electrode and a secondary side electrode formed on a piezoelectric element, in which an AC voltage entering from the primary side electrode is converted and output from the secondary side electrode, a cold cathode tube connected to the secondary side of the piezoelectric transformer, a cold cathode tube output detection part for detecting that an impedance of the cold cathode tube reaches a predetermined value, and a control part for setting a driving frequency of the piezoelectric transformer as a first frequency when starting a power supply for the cold cathode tube and changing the driving frequency from the first frequency to the second frequency without a sweep according to the result of detection by the cold cathode tube output detection part.

To achieve the above object, a second cold cathode tube emission device according to the present invention includes at least a piezoelectric transformer having a primary side electrode and a secondary side electrode formed on a piezoelectric element, in which an AC voltage entering from the primary side electrode is converted and output from the secondary side electrode, a cold cathode tube connected to the secondary side of the piezoelectric transformer, a cold cathode tube output detection part for detecting that an impedance of the cold cathode tube reaches a predetermined value, a transformer characteristic detection part for detecting characteristics of the piezoelectric transformer, and a control part for performing a driving control of the piezoelectric transformer with a second electric power having a level of not lighting the cold cathode tube before supplying the cold cathode tube steadily with a first electric power, and based on the characteristics of the piezoelectric transformer detected by the transformer characteristic detection part, performing a setting control of a driving frequency of the piezoelectric transformer according to the result of detection by the cold cathode tube output detection part when the first electric power is supplied steadily.

To achieve the above object, a third cold cathode tube emission device according to the present invention includes at least a piezoelectric transformer having a primary side electrode and a secondary side electrode formed on a piezoelectric element, in which an AC voltage entering from the primary side electrode is converted and output from the secondary side electrode, a cold cathode tube connected to the secondary side of the piezoelectric transformer, a cold cathode tube output detection part for detecting that an impedance of the cold cathode tube reaches a predetermined value, a transformer characteristic detection part for detecting characteristics of the piezoelectric transformer, and a control part for determining a second frequency by assuming characteristics of the piezoelectric transformer classified in advance by a certain characteristic parameter, based on the result of classification by the characteristic parameter and the result of detection by the transformer characteristic detection part when driving the piezoelectric transformer with a predetermined first frequency, and setting a driving frequency of the piezoelectric transformer as the first frequency when starting a power supply for the cold cathode tube and changing the driving frequency from the first frequency to a second frequency without a sweep according to the result of detection by the cold cathode tube output detection part.

To achieve the above object, a first liquid crystal panel according to the present invention is a liquid crystal panel whose luminance is controlled by a built-in cold cathode tube emission device, and the cold cathode tube emission device is characterized by including at least a piezoelectric transformer having a primary side electrode and a secondary side electrode formed on a piezoelectric element, in which an AC voltage entering from the primary side electrode is converted and output from the secondary side electrode, a cold cathode tube connected to the secondary side of the piezoelectric transformer, a cold cathode tube output detection part for detecting that an impedance of the cold cathode tube reaches a predetermined value, and a control part for setting a driving frequency of the piezoelectric transformer as a first frequency when starting a power supply for the cold cathode tube and changing the driving frequency from the first frequency to a second frequency without a sweep according to the result of detection by the cold cathode tube output detection part.

To achieve the above object, a second liquid crystal panel according to the present invention is a liquid crystal panel whose luminance is controlled by a built-in cold cathode tube emission device, and the cold cathode tube emission device includes at least a piezoelectric transformer having a primary side electrode and a secondary side electrode formed on a piezoelectric element, in which an AC voltage entering from the primary side electrode is converted and output from the secondary side electrode, a cold cathode tube connected to the secondary side of the piezoelectric transformer, a cold cathode tube output detection part for detecting that an impedance of the cold cathode tube reaches a predetermined value, a transformer characteristic detection part for detecting characteristics of the piezoelectric transformer, and a control part for performing a driving control of the piezoelectric transformer with a second electric power having a level of not lighting the cold cathode tube before supplying the cold cathode tube steadily with a first electric power, and based on the characteristics of the piezoelectric transformer detected by the transformer characteristic detection part, performing a setting control of a driving frequency of the piezoelectric transformer according to the result of detection by the cold cathode tube output detection part when the first electric power is supplied steadily.

To achieve the above object, a third liquid crystal panel according to the present invention is a liquid crystal panel whose luminance is controlled by a built-in cold cathode tube emission device, and the cold cathode tube emission device includes at least a piezoelectric transformer having a primary side electrode and a secondary side electrode formed on a piezoelectric element, in which an AC voltage entering from the primary side electrode is converted and output from the secondary side electrode, a cold cathode tube connected to the secondary side of the piezoelectric transformer, a cold cathode tube output detection part for detecting that an impedance of the cold cathode tube reaches a predetermined value, a transformer characteristic detection part for detecting characteristics of the piezoelectric transformer, and a control part for determining a second frequency by assuming characteristics of the piezoelectric transformer classified in advance by a certain characteristic parameter, based on the result of classification by the characteristic parameter and the result of detection by the transformer characteristic detection part when driving the piezoelectric transformer with a predetermined first frequency, and setting a driving frequency of the piezoelectric transformer as the first frequency when starting a power supply for the cold cathode tube and changing the driving frequency from the first frequency to the second frequency without a sweep according to the result of detection by the cold cathode tube output detection part.

To achieve the above object, a first liquid crystal panel built-in apparatus according to the present invention is an apparatus incorporated with a liquid crystal panel whose luminance is controlled by a built-in cold cathode tube emission device, and the cold cathode tube emission device includes at least a piezoelectric transformer having a primary side electrode and a secondary side electrode formed on a piezoelectric element, in which an AC voltage entering from the primary side electrode is converted and output from the secondary side electrode, a cold cathode tube connected to the secondary side of the piezoelectric transformer, a cold cathode tube output detection part for detecting that an impedance of the cold cathode tube reaches a predetermined value, and a control part for setting a driving frequency of the piezoelectric transformer as a first frequency when starting a power supply for the cold cathode tube and changing the driving frequency from the first frequency to a second frequency without a sweep according to the result of detection by the cold cathode tube output detection part.

To achieve the above object, a second liquid crystal panel built-in apparatus according to the present invention is an apparatus incorporated with a liquid crystal panel whose luminance is controlled by a built-in cold cathode tube emission device, and the cold cathode tube emission device includes at least a piezoelectric transformer having a primary side electrode and a secondary side electrode formed on a piezoelectric element, in which an AC voltage entering from the primary side electrode is converted and output from the secondary side electrode, a cold cathode tube connected to the secondary side of the piezoelectric transformer, a cold cathode tube output detection part for detecting that an impedance of the cold cathode tube reaches a predetermined value, a transformer characteristic detection part for detecting characteristics of the piezoelectric transformer, and a control part for performing a driving control of the piezoelectric transformer with a second electric power having a level of not lighting the cold cathode tube before supplying the cold cathode tube steadily with a first electric power, and based on the characteristics of the piezoelectric transformer detected by the transformer characteristic detection part, performing a setting control of a driving frequency of the piezoelectric transformer according to the result of detection by the cold cathode tube output detection part when the first electric power is supplied steadily.

To achieve the above object, a third liquid crystal panel built-in apparatus according to the present invention is an apparatus incorporated with a liquid crystal panel whose luminance is controlled by a built-in cold cathode tube emission device, and the cold cathode tube emission device includes at least a piezoelectric transformer having a primary side electrode and a secondary side electrode formed on a piezoelectric element, in which an AC voltage entering from the primary side electrode is converted and output from the secondary side electrode, a cold cathode tube connected to the secondary side of the piezoelectric transformer, a cold cathode tube output detection part for detecting that an impedance of the cold cathode tube reaches a predetermined value, a transformer characteristic detection part for detecting characteristics of the piezoelectric transformer, and a control part for determining a second frequency by assuming characteristics of the piezoelectric transformer classified in advance by a certain characteristic parameter, based on the result of classification by the characteristic parameter and the result of detection by the transformer characteristic detection part when driving the piezoelectric transformer with a predetermined first frequency, and setting a driving frequency of the piezoelectric transformer as the first frequency when starting a power supply for the cold cathode tube and changing the driving frequency from the first frequency to the second frequency without a sweep according to the result of detection by the cold cathode tube output detection part.

According to the first driving method and circuit of the piezoelectric transformer, the piezoelectric transformer can be driven with high driving efficiency independently of an impedance change of the load. Furthermore, even if the impedance of the load changes abruptly, a large amount of electric current is less likely to flow to the piezoelectric transformer, so that a strong distortion occurring in the piezoelectric transformer can be suppressed, and mechanical damage imposed on the piezoelectric transformer itself also can be suppressed.

According to the second driving method and circuit of the piezoelectric transformer, before supplying the load steadily with first electric power (for example, several kV order by voltage), second electric power (for example, several V order by voltage) that is sufficiently smaller than the first electric power is supplied within a predetermined range from the frequency that is higher than the resonance frequency in a state in which the secondary side of the piezoelectric transformer is open, with regard to the frequency at one point or a plurality of points, and the driving frequency of the piezoelectric transformer for the time when supplying the load with the first electric power is set based on characteristics of the piezoelectric transformer, for example, measurements of impedance or voltage etc. Accordingly, the piezoelectric transformer can be driven with high driving efficiency by corresponding to the characteristic variance arising from the shape or the material characteristics etc. of the piezoelectric transformer.

According to the third driving method and circuit of the piezoelectric transformer, the piezoelectric transformer to be used is classified in advance based on a characteristic parameter, for example, frequency characteristics such as impedance or an electric current etc., and by setting the characteristic parameter relative to the frequency in advance for the classified piezoelectric transformer, piezoelectric transformers with different specifications also can be driven with high driving efficiency.

By incorporating a cold cathode tube emission device that controls the emission of a cold cathode tube by the first, the second or the third driving circuit described above into a liquid crystal panel, and by incorporating this liquid crystal panel into an apparatus such as a mobile phone or a communication terminal etc., the driving frequency is not swept when lighting the cold cathode tube, so that negative effects on the apparatus caused by noise or a cross modulation can be eliminated.

DESCRIPTION OF THE PREFERRED EMBODIMENTS

Hereinafter, the preferred embodiments of the present invention will be described with reference to the drawings.

First Embodiment

Figure 1:
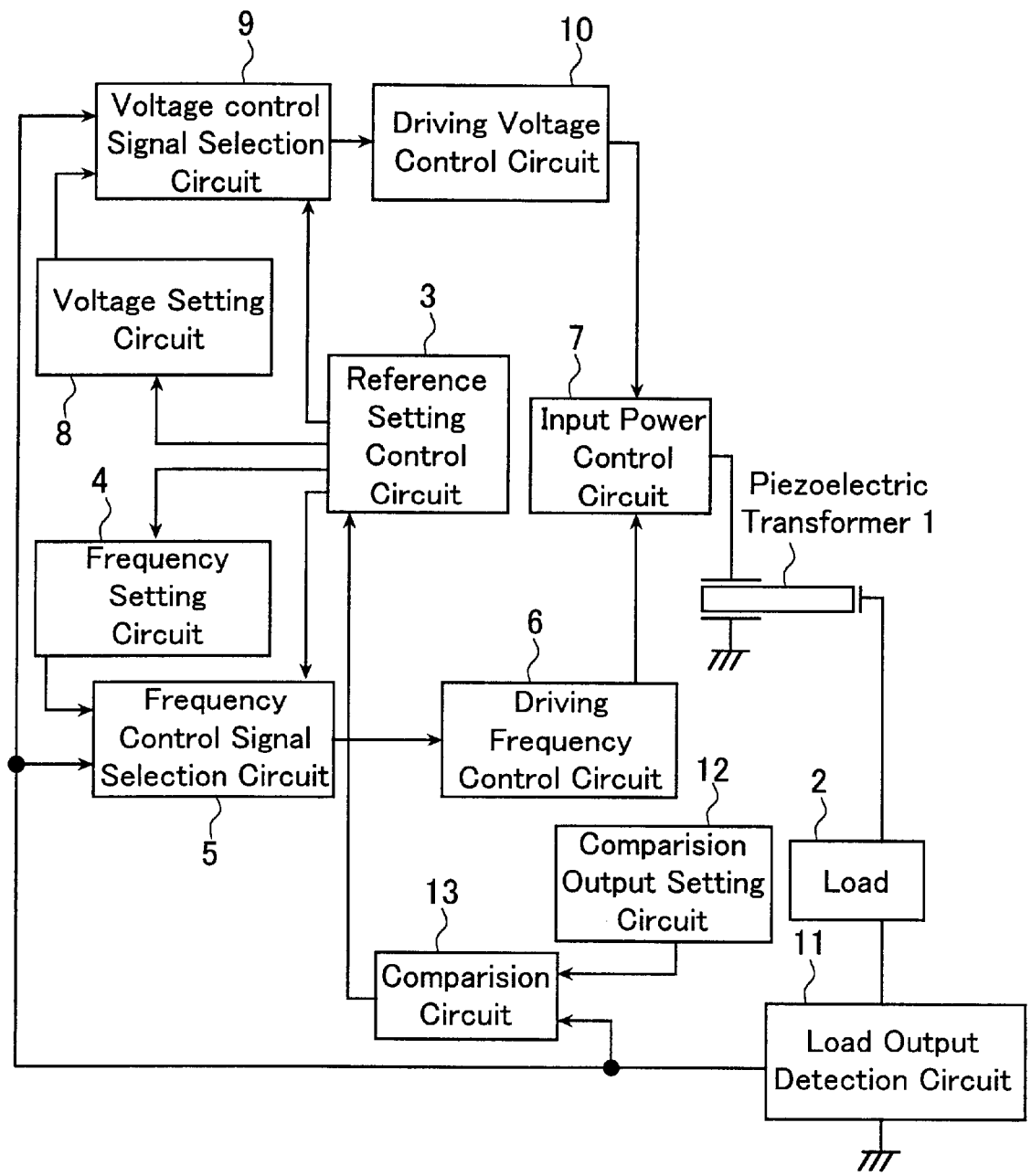
FIG. 1 is a block diagram showing a configuration example of a driving circuit of a piezoelectric transformer according to a first embodiment of the present invention.
Figure 2:
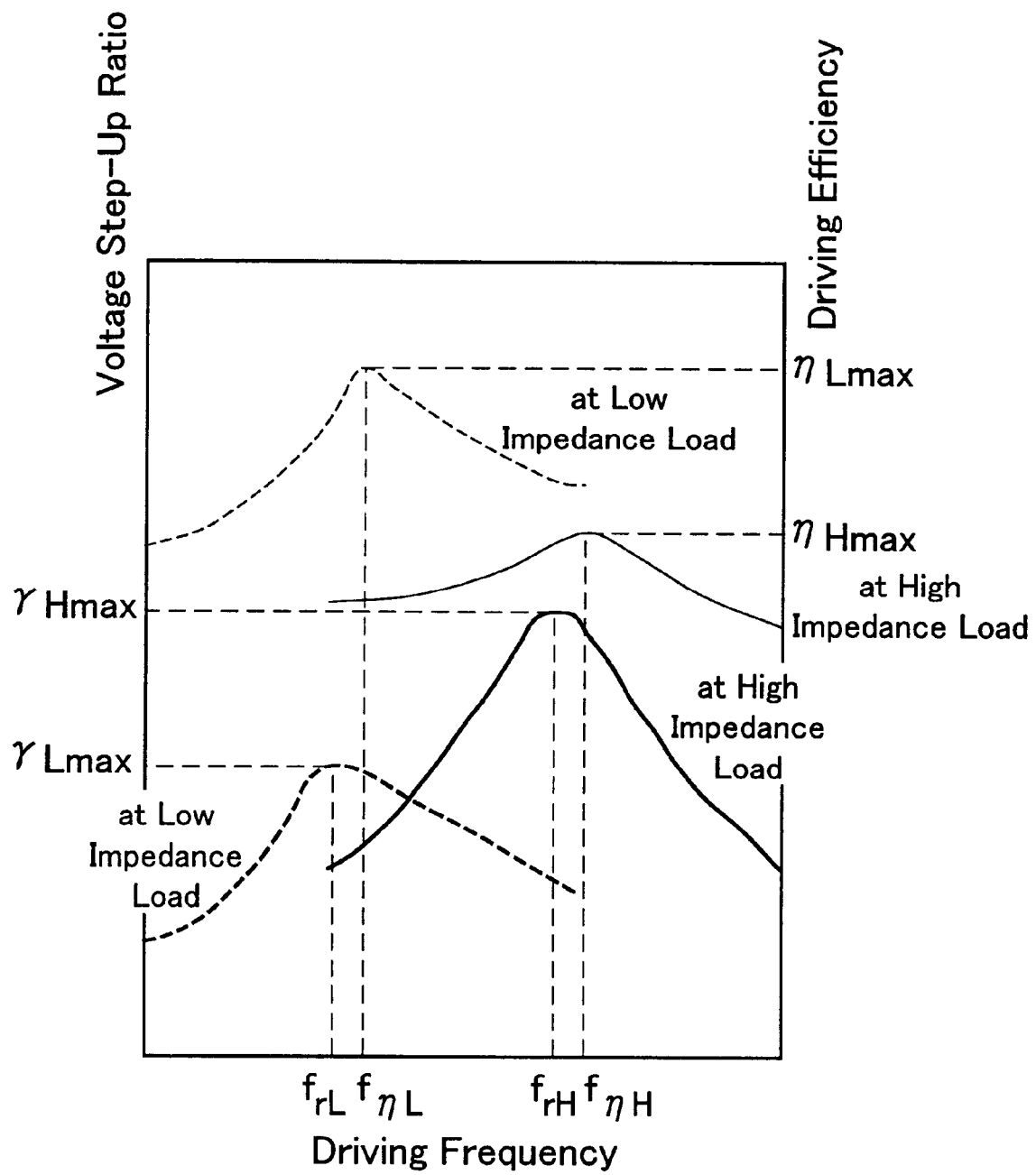
FIG. 2 is a graph showing a voltage step-up ratio and driving efficiency relative to an impedance of a load connected to a piezoelectric transformer.

FIG. 1 is a block diagram showing a configuration example of a driving circuit of a piezoelectric transformer according to a first embodiment of the present invention, and FIG. 2 is a graph showing the relationship between a voltage step-up ratio and driving efficiency relative to a driving frequency of a piezoelectric transformer according to impedance characteristics of a load connected to the secondary side of the piezoelectric transformer.

FIG. 1 shows a piezoelectric transformer 1, a load 2, a reference setting control circuit 3, a frequency setting circuit 4, a frequency control signal selection circuit 5, a driving frequency control circuit 6, an input power control circuit 7, a voltage setting circuit 8, a voltage control signal selection circuit 9, a driving voltage control circuit 10, a load output detection circuit 11, a comparison output setting circuit 12 and a comparison circuit 13. Here, the components other than the piezoelectric transformer 1, the load 2, the input power control circuit 7 and the load output detection circuit 11 together are called a control part as well.

In FIG. 2, the horizontal axis shows a driving frequency of the piezoelectric transformer, and the vertical axis on the left side shows a voltage step-up ratio indicating a ratio of a voltage output from the secondary side relative to the voltage applied to the primary side of the piezoelectric transformer, and furthermore, the vertical axis on the right side shows driving efficiency, indicating a ratio of electric power output from the secondary side relative to the electric power applied to the primary side of the piezoelectric transformer. A thick solid line shows a change in the voltage step-up ratio relative to the driving frequency in the case where a load connected to the piezoelectric transformer is a high impedance load that is sufficiently higher than the output impedance on the secondary side of the piezoelectric transformer, and a thick broken line shows the change in the case of a low impedance load almost as low as the output impedance on the secondary side of the piezoelectric transformer, respectively. Furthermore, a thin solid line shows a change in the driving efficiency relative to the driving frequency in the case where a load connected to the piezoelectric transformer is a high impedance load that is sufficiently higher than the output impedance on the secondary side of the piezoelectric transformer, and a thin broken line shows the change in the case of a low impedance load almost as low as the output impedance on the secondary side of the piezoelectric transformer, respectively.

Generally in a piezoelectric transformer, due to the size difference between the output impedance on the secondary side of the piezoelectric transformer and the impedance of the load connected to the secondary side, frequency characteristics of a voltage step-up ratio and driving efficiency relative to a driving frequency are different. As shown in FIG. 2, in the case where the impedance of the load connected to the secondary side of the piezoelectric transformer is sufficiently larger than the output impedance of the piezoelectric transformer and is a high impedance that can be regarded as almost infinite when seen from the output impedance, the voltage step-up ratio shows, as indicated by the thick solid line, the frequency characteristics such that the voltage step-up ratio reaches its maximum value $\gamma_{Hmax}$ with driving frequency $f_{\gamma H}$, and the driving efficiency shows, as indicated by the thin solid line, the frequency characteristics such that the driving efficiency reaches its maximum value $\eta_{Hmax}$ with driving frequency $f_{\eta H}$.

Furthermore, as shown in FIG. 2, in the case where the impedance of the load connected to the secondary side of the piezoelectric transformer is a low impedance almost as low as the output impedance of the piezoelectric transformer, the voltage step-up ratio shows the frequency characteristics indicated by the thick broken line that shows its maximum value $\gamma_{Lmax}$ with a frequency $f_{\gamma L}$ that is lower than the frequency $f_{\gamma H}$ showing the maximum voltage step-up ratio $\gamma_{Hmax}$ when a high impedance load is connected. The driving efficiency also shows the frequency characteristics indicated by the thin broken line that shows its maximum value $\eta_{Lmax}$ with a frequency $f_{\eta L}$ that is lower than the frequency $f_{\eta H}$ showing the maximum driving efficiency $\eta_{Hmax}$ when a high impedance load is connected.

The operation of the driving circuit of the piezoelectric transformer, which is characterized in that the frequency characteristics of the voltage step-up ratio and the driving efficiency are different depending on the impedance of the load to be connected as described above, will be explained by referring to FIG. 1 and FIG. 2.

In FIG. 1, based on the signal from the reference setting control circuit 3, the frequency setting circuit 4 sets a first frequency, and the voltage setting circuit 8 sets a voltage with a first amplitude, respectively. Also, the frequency control signal selection circuit 5 selects the signal from the frequency setting circuit 4 as a control signal for the driving frequency control circuit 6, and the voltage control signal selection circuit 9 selects the signal from the voltage setting circuit 8 as a control signal for the driving voltage control circuit 10. Based on the driving frequency control signal from the driving frequency control circuit 6 and the driving voltage control signal from the driving voltage control circuit 10, the input power control circuit 7 supplies electric power to the primary side of the piezoelectric transformer 1.

The input power control circuit 7, which includes a switching element, an inductive element etc., can step up the voltage to a voltage needed to be supplied to the piezoelectric transformer 1 or can supply a necessary current. The electric power supplied from the input power control circuit 7 is stepped up by the piezoelectric transformer 1 and supplied to the load 2. The output from the load 2 is detected by the load output detection circuit 11. The comparison circuit 13 compares the signal from the comparison output setting circuit 12 with the signal from the load output detection circuit 11 corresponding to the output from the load 2, and when the output from the load 2 reaches an output level set by the comparison output setting circuit 12, the comparison circuit 13 sends a signal to the reference setting control circuit Based on the signal from the comparison circuit 13, the reference setting control circuit 3 controls the frequency setting circuit 4 and the voltage setting circuit 8 and sets a second frequency and a voltage with a second amplitude respectively, so that the driving frequency of the piezoelectric transformer 1 can be changed from the first frequency to the second frequency without a frequency sweep. In addition, the driving voltage of the piezoelectric transformer 1 also can be changed from the voltage with the first amplitude to the voltage with the second amplitude.

Furthermore, since the signal from the load output detection circuit 11 is sent respectively to the driving frequency control circuit 6 via the frequency control signal selection circuit 5 and to the driving voltage control circuit 10 via the voltage control signal selection circuit 9, the driving frequency or the driving voltage can be controlled so as to maintain a constant load output or to change the load output.

In the circuit including the elements operating in this way, an example of using a cold cathode tube as the load will be further explained.

In the case of connecting a cold cathode tube showing a high impedance of not less than several hundreds of MΩ until it starts to light and an abrupt impedance decrease to about several hundreds of Ω during lighting as the load 2, in the initial state until the cold cathode tube starts to light, the frequency characteristics of the voltage step-up ratio and the driving efficiency of the piezoelectric transformer correspond to a case in which a high impedance load is connected to the secondary side of the piezoelectric transformer shown in FIG. 2, and during lighting, the frequency characteristics thereof correspond to a case in which a low impedance load is connected to the secondary side of the piezoelectric transformer.

In FIG. 1, in order to control so as to achieve maximum driving efficiency corresponding to an impedance change of the cold cathode tube connected as the load 2 to the piezoelectric transformer 1, before the cold cathode tube starts to light, based on the signal from the reference setting control circuit 3, the frequency setting circuit 4 sets a first frequency $f_{\eta H}$ and the voltage setting circuit 8 sets a voltage with a first amplitude $V_1$ respectively. Also, the frequency control signal selection circuit 5 selects the signal from the frequency setting circuit 4 as a control signal for the driving frequency control circuit 6, and the voltage control signal selection circuit 9 selects the signal from the voltage setting circuit 8 as a control signal for the driving voltage control circuit 10. Based on the driving frequency control signal from the driving frequency control circuit 6 and the driving voltage control signal from the driving voltage control circuit 10, the input power control circuit 7 supplies electric power to the primary side of the piezoelectric transformer 1.

In the cold cathode tube serving as the load 2, an electric current scarcely flows until it lights, but as soon as the cold cathode tube starts to light, an electric current starts to flow. When the comparison circuit 13 detects that the output signal from the load output detection circuit 11 detecting the output from the load 2 reaches an output level of the comparison output setting circuit 12 predetermined for changing the driving frequency and the voltage amplitude of the piezoelectric transformer 1, the comparison circuit 13 sends a signal to the reference setting control circuit 3. The reference setting control circuit 3 controls the frequency setting circuit 4 and the voltage setting circuit 8, and sets a second frequency $f_{nL}$ and a voltage with a second amplitude $V_2$ respectively, so that the driving frequency of the piezoelectric transformer 1 can be changed from the first frequency $f_{nH}$ to the second frequency $f_{nL}$ without a frequency sweep. Furthermore, the driving voltage of the piezoelectric transformer 1 also can be changed from the voltage with the first amplitude $V_1$ to the voltage with the second amplitude $V_2$.

Furthermore, when the cold cathode tube serving as the load 2 starts to light steadily, the reference setting control circuit 3 controls the frequency control selection circuit 5 and the voltage control selection circuit 9, and thus, the output signal from the load output detection circuit 11 is sent respectively to the driving frequency control circuit 6 via the frequency control signal selection circuit 5 and to the driving voltage control circuit 10 via the voltage control signal selection circuit 9. Therefore, by controlling the driving frequency or the driving voltage of the piezoelectric transformer 1, the lighting cold cathode tube can be controlled to show constant brightness, or the cold cathode tube can be controlled to change the brightness to become constant, that is to adjust the light.

The above embodiment was described by referring to the case of setting so as to achieve maximum driving efficiency constantly relative to the impedance change of the load connected to the piezoelectric transformer. However, the present embodiment is not limited to controlling for constantly showing maximum efficiency relative to the impedance change of the load, but is also capable of setting so as to achieve a maximum voltage step-up ratio. Furthermore, it is also possible to drive the piezoelectric transformer at a frequency showing a maximum voltage step-up ratio when the impedance of the load is high, and to drive at a frequency showing maximum driving efficiency when the impedance of the load is low.

Furthermore, the present embodiment is not only realized by the driving circuit including the components shown in FIG. 1 and may be realized by other components as long as the functions of the components in FIG. 1 can be fulfilled by the other components.

In addition, it is also possible to handle the setting of the driving frequency and the driving voltage of the piezoelectric transformer by the control part based on the signal from the load output detection circuit 11 in FIG. 1 like a software by using a microcomputer or peripheral equipment such as a data storage device, e.g. memory.

Second Embodiment

Figure 3:
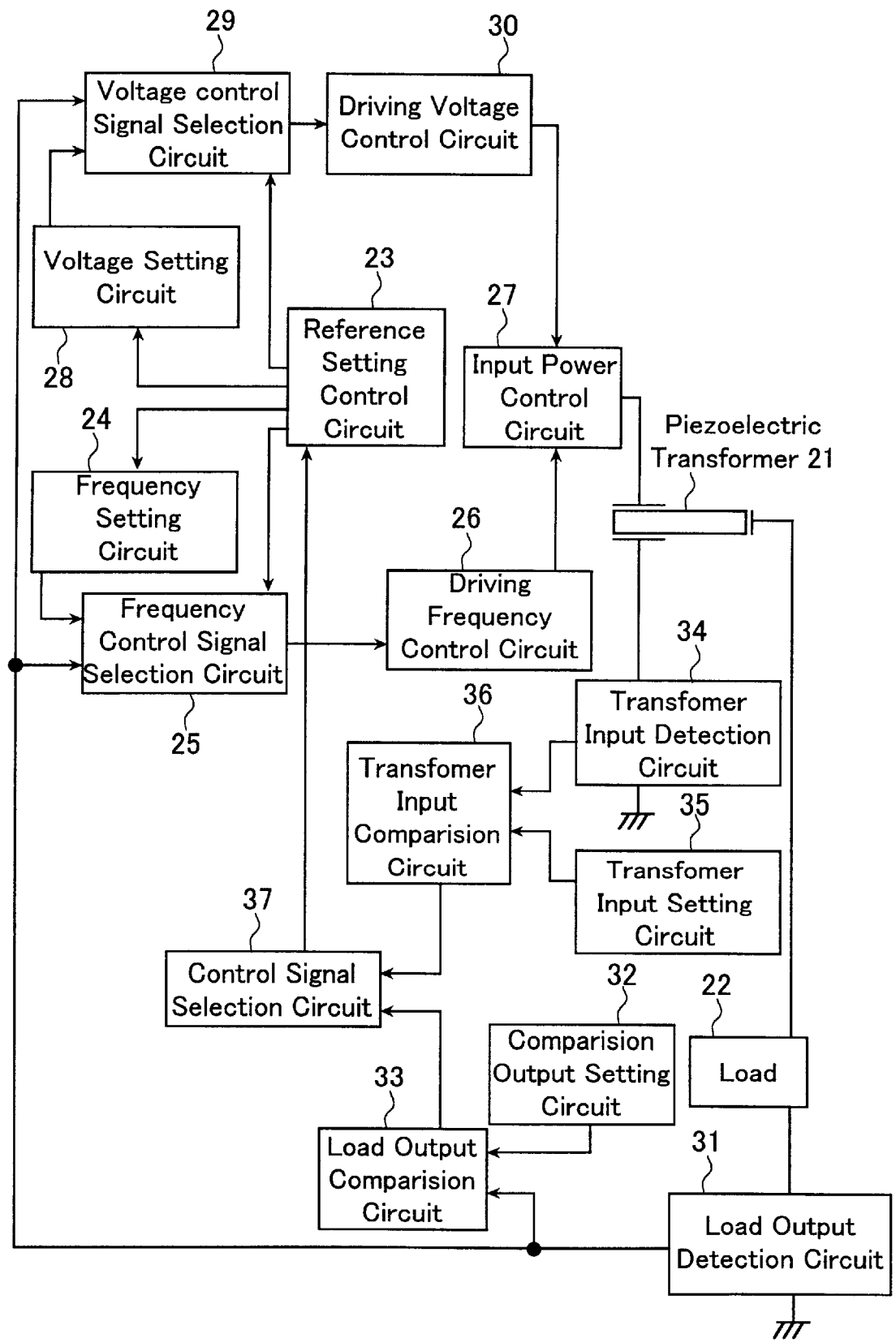
FIG. 3 is a block diagram showing a configuration example of a driving circuit of a piezoelectric transformer according to a second embodiment of the present invention.
Figure 4:
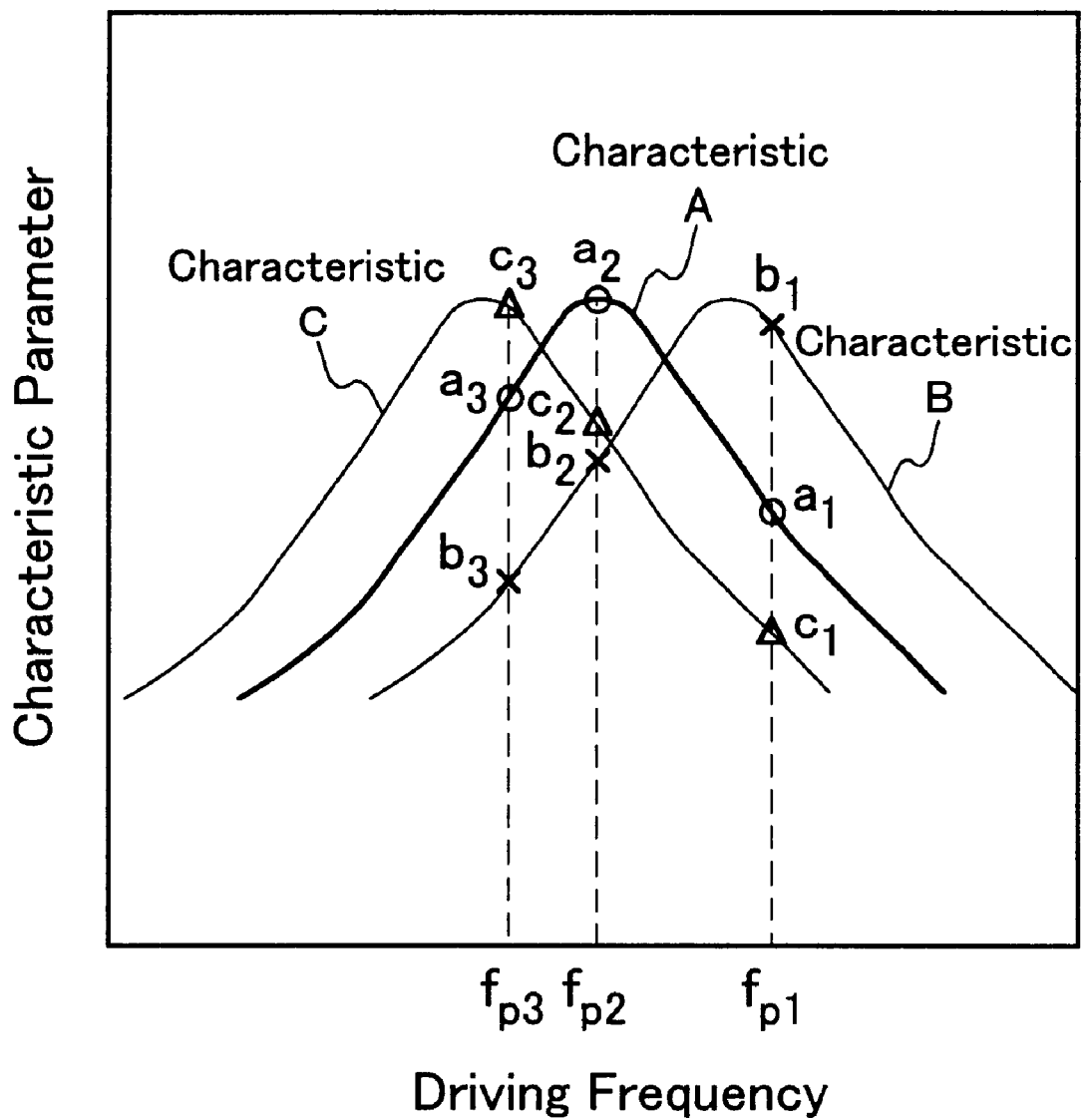
FIG. 4 is a graph showing characteristic parameters relative to a driving frequency of the piezoelectric transformer in the second embodiment of the present invention.
Figure 5:
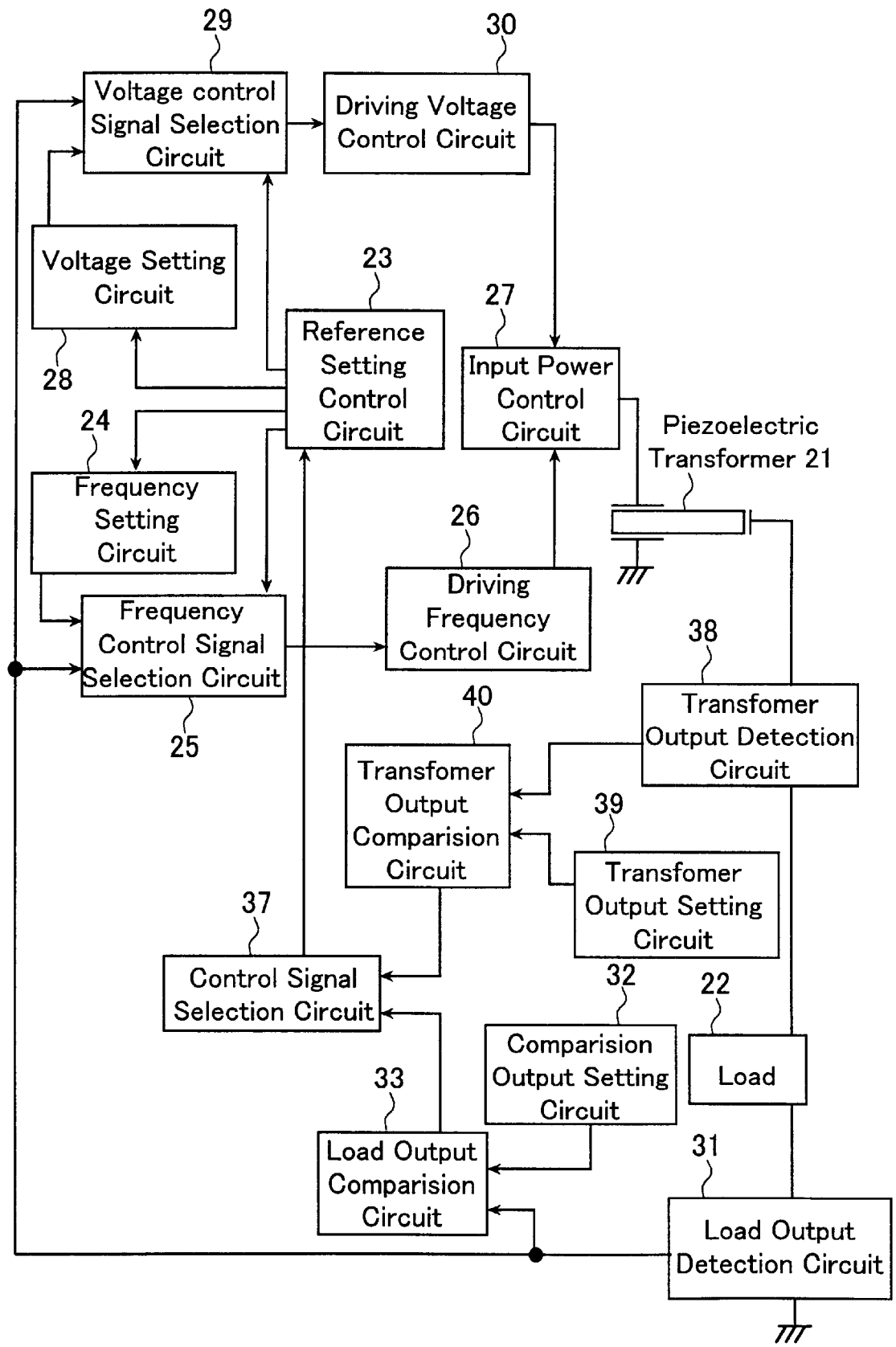
FIG. 5 is a block diagram showing a modified example of a driving circuit of the piezoelectric transformer according to the second embodiment of the present invention.
Figure 6:
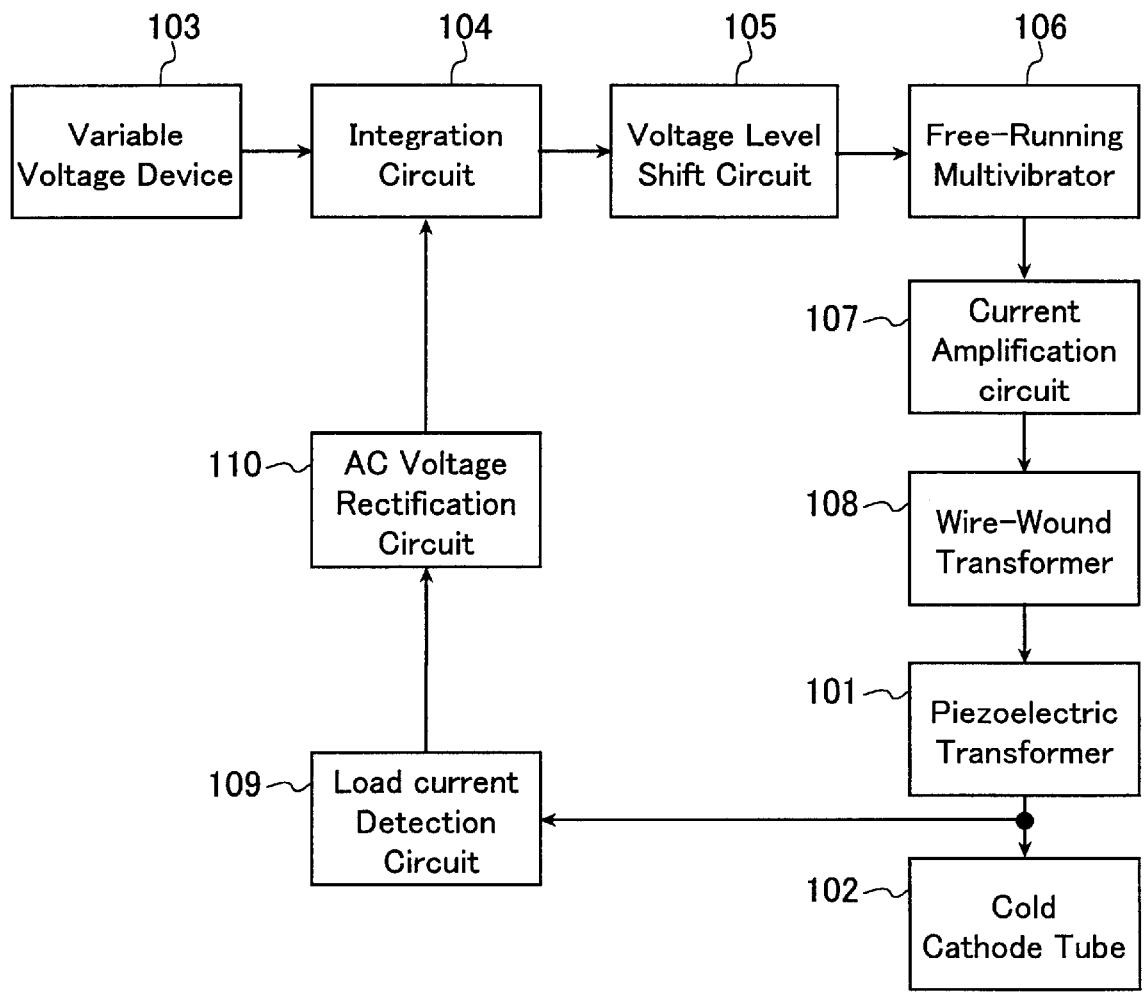
FIG. 6 is a block diagram showing an example of a conventional piezoelectric transformer driving device.
Figure 7:
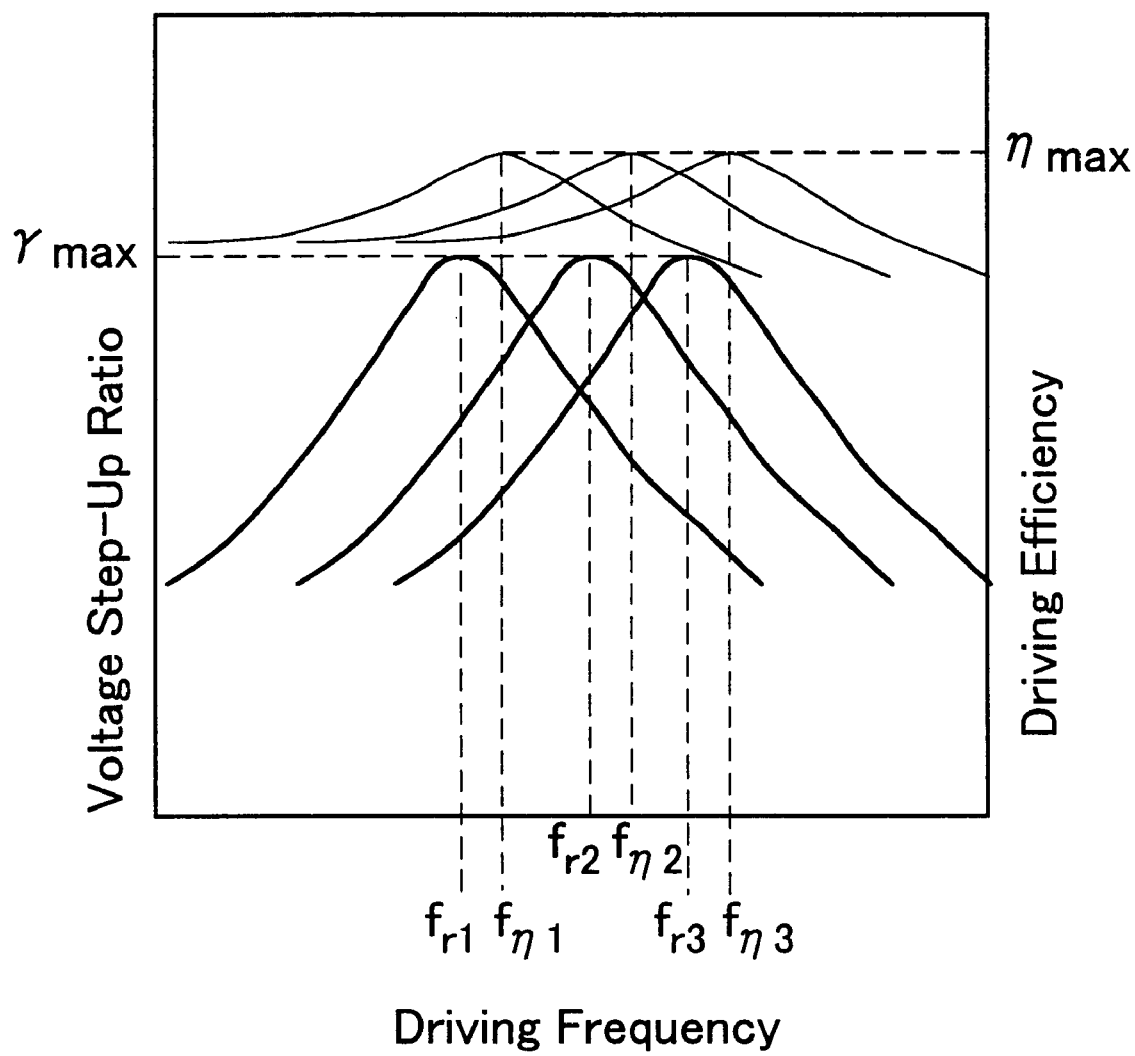
FIG. 7 is a graph showing a voltage step-up ratio and driving efficiency relative to a driving frequency of a piezoelectric transformer.

FIG. 3 is a block diagram showing a configuration example of a driving circuit of a piezoelectric transformer according to a second embodiment of the present invention. FIG. 4 is a graph showing frequency characteristics of a characteristic parameter of the piezoelectric transformer and the variance. FIG. 5 is a block diagram showing a modified example of a driving circuit of the piezoelectric transformer according to the second embodiment of the present invention.

FIG. 3 shows a piezoelectric transformer 21, a load 22, a reference setting control circuit 23, a frequency setting circuit 24, a frequency control signal selection circuit 25, a driving frequency control circuit 26, an input power control circuit 27, a voltage setting circuit 28, a voltage control signal selection circuit 29, a driving voltage control circuit 30, a load output detection circuit 31, a comparison output setting circuit 32, a load output comparison circuit 33, a transformer input detection circuit (transformer characteristic detection part) 34, a transformer input setting circuit 35, a transformer input comparison circuit 36 and a control signal selection circuit 37. Here, the components other than the piezoelectric transformer 21, the load 22, the input power control circuit 27 and the load output detection circuit 31 together are called a control part as well.

FIG. 4 shows an example of a characteristic parameter of the piezoelectric transformer, and the piezoelectric transformer is classified in advance into three groups of characteristic A, characteristic B and characteristic C. With regard to three driving frequencies $f_{P1}$, $f_{P2}$, $f_{P3}$, the characteristic parameters of the piezoelectric transformer for the characteristic A are $a_1$, $a_2$, $a_3$ respectively, the characteristic parameters of the piezoelectric transformer for the characteristic B are $b_1$, $b_2$, $b_3$ respectively, and the characteristic parameters of the piezoelectric transformer for the characteristic C are $c_1$, $c_2$, $C_3$ respectively.

Furthermore, in FIG. 5, the reference numbers 21 to 33 and 37 are the same elements as those included in the block diagram shown in FIG. 3. In addition, FIG. 5 shows a transformer output detection circuit 38, a transformer output setting circuit 39 and a transformer output comparison circuit 40.

The operation of the driving circuit of the piezoelectric transformer considering the individual variance of the frequency characteristics of the impedance seen from the primary side or a resonance frequency, etc. will be explained by using a cold cathode tube as the load 22 with reference to FIG. 3, FIG. 4 and FIG. 5.

In FIG. 3, first of all, in order to detect the degree of characteristic variance of impedance or a resonance frequency etc. of the piezoelectric transformer, a voltage with an amplitude of about several V, which is sufficiently smaller than that for lighting the cold cathode tube, is applied to the primary side of the piezoelectric transformer 21 by the reference setting control circuit 23. In the case where the load 22 is a cold cathode tube, a voltage of several kV order needs to be applied for lighting the cold cathode tube, but when only a voltage of about several V is supplied to the primary side of the piezoelectric transformer 21, the cold cathode tube is in a high impedance state of not less than several hundreds of MΩ, and the piezoelectric transformer 21 is regarded as the same as in a state in which the secondary side is open.

The voltage setting circuit 28 sets a driving voltage control signal for the driving voltage control circuit 30 via the voltage control signal selection circuit 29, and the frequency setting circuit 24 sets a frequency control signal within a range considering the resonance frequency variance of the piezoelectric transformer 21 via the frequency control signal selection circuit 25. Based on these control signals, the input power control circuit 27 including a switching element, an inductive element etc., which can step up the voltage to a voltage needed to be supplied to the piezoelectric transformer 21 or can supply a necessary current, applies a voltage of about several V, which is sufficiently smaller than that for lighting the cold cathode tube, to the primary side of the piezoelectric transformer 21.

In the transformer input setting circuit 35, characteristic parameters of the piezoelectric transformer that may be used, for example, a value of impedance, an electric current etc. relative to the frequency characteristics are set. For example, as shown in FIG. 4, in the case where the piezoelectric transformer 21 is classified in advance into three groups, and the characteristic parameter of the piezoelectric transformer is set as $a_1$ when the driving frequency is $f_{P_1}$ in the transformer input setting circuit 35, and when the signal based on the value detected by the transformer input detection circuit 34 is $b_1$, the transformer input comparison circuit 36 judges that the signal $b_1$, from the transformer input detection circuit 34 has a larger characteristic parameter than the set value $a_1$ in the input setting circuit 35. This judgement result is sent to the reference setting control circuit 23 via the control signal selection circuit 37, and the reference setting control circuit 23 judges that at present the piezoelectric transformer 21 connected to the driving circuit is a piezoelectric transformer with the characteristic B. The characteristics of the piezoelectric transformer 21 can be detected by conducting this measurement/control once or several times by changing the driving frequency.

In addition, as the characteristic parameter of the piezoelectric transformer, a value of efficiency or a voltage step-up ratio relative to the frequency characteristics can be used instead of the value of the impedance relative to the frequency characteristics.

Based of these detected characteristics, an amplitude and a frequency of a voltage to be applied to the piezoelectric transformer 21 are set by the reference setting control circuit 23. The frequency setting circuit 24 sets a first frequency $f_{B\eta H}$, and the voltage setting circuit 28 sets a voltage with a first amplitude $V_{B1}$, respectively. Also, the frequency control signal selection circuit 25 selects the signal from the frequency setting circuit 24 as a control signal for the driving frequency control circuit 26, and the voltage control signal selection circuit 29 selects the signal from the voltage setting circuit 28 as a control signal for the driving voltage control circuit 30. Based on the driving frequency control signal from the driving frequency control circuit 26 and the driving voltage control signal from the driving voltage control circuit 30, the input power control circuit 27 supplies electric power to the primary side of the piezoelectric transformer 21.

In the cold cathode tube serving as the load 22, an electric current scarcely flows until it lights, but as soon as the cold cathode tube starts to light, an electric current starts to flow. When the load output comparison circuit 33 detects that the output signal from the load output detection circuit 31 detecting the output from the load 22 reaches an output level of the comparison output setting circuit 32 predetermined for changing the driving frequency and the voltage amplitude of the piezoelectric transformer 21, the load output comparison circuit 33 sends a signal to the reference setting control circuit 23 via the control signal selection circuit 37.

The reference setting control circuit 23 controls the frequency setting circuit 24 and the voltage setting circuit 28, and sets a second frequency $f_{B\eta L}$ and a voltage with a second amplitude $VB_2$ respectively, so that the driving frequency of the piezoelectric transformer 21 can be changed from the first frequency $f_{B\eta H}$ to the second frequency $f_{B\eta L}$ without a frequency sweep.

Furthermore, the driving voltage of the piezoelectric transformer 21 also can be changed from the voltage with the first amplitude $V_{B1}$ to the voltage with the second amplitude $V_{B2}$.

Furthermore, when the cold cathode tube serving as the load 22 starts to light steadily, the reference setting control circuit 23 controls the frequency control selection circuit 25 and the voltage control signal selection circuit 29, and thus, the output signal from the load output detection circuit 31 is sent respectively to the driving frequency control circuit 26 via the frequency control signal selection circuit 25 and to the driving voltage control circuit 30 via the voltage control signal selection circuit 29. Therefore, by controlling the driving frequency or the driving voltage of the piezoelectric transformer 21, the lighting cold cathode tube can be controlled to show constant brightness, or the cold cathode tube can be controlled to change the brightness to become constant, that is to adjust the light.

Furthermore, FIG. 5 is a block diagram showing a modified example of a driving circuit of the piezoelectric transformer according to the second embodiment of the present invention.

A difference between the driving circuit of FIG. 5 and the driving circuit of FIG. 3 is whether the characteristic parameter of the piezoelectric transformer 21 is detected on the secondary side or on the primary side of the piezoelectric transformer 21. In the driving circuit of FIG. 5, the characteristic parameter of the piezoelectric transformer is detected by the transformer output detection circuit 38 connected to the secondary side, and the characteristic parameters of the piezoelectric transformer 21 that possibly may be used are set by the transformer output setting circuit 39.

Furthermore, the transformer output comparison circuit 40 sends the judgement result of which characteristic is the characteristic parameter of the piezoelectric transformer 21 connected to the driving circuit to the reference setting control circuit 23 via the control signal selection circuit 37. The operation of the driving circuit after detecting the characteristics of the piezoelectric transformer 21 connected to the driving circuit is the same as the operation of the driving circuit shown in FIG. 3.

The above embodiment was described by referring to the case of setting so as to constantly achieve maximum driving efficiency relative to the impedance change of the load connected to the piezoelectric transformer. However, the present invention is not limited to controlling for constantly showing maximum efficiency relative to the impedance change of the load, but is also capable of setting so as to achieve a maximum voltage step-up ratio. Furthermore, it is also possible to drive the piezoelectric transformer at a plurality of frequencies without a sweep of the driving frequency such that the piezoelectric transformer is driven at a frequency showing the maximum voltage step-up ratio when the impedance of the load is high and at a frequency showing maximum driving efficiency when the impedance of the load is low.

Furthermore, the present embodiment is not only realized by the driving circuits including the components shown in FIG. 3 and FIG. 5 and may be realized by other components as long as the functions of the components in FIG. 3 and FIG. 5 can be fulfilled by the other components.

Furthermore, it is also possible to realize the function of the control part to discriminate the characteristics of the piezoelectric transformer 21 based on the signal from the transformer input detection circuit 34 in FIG. 3, to discriminate the characteristics of the piezoelectric transformer 21 based on the signal from the transformer output detection circuit 38 in FIG. 5, and to set the driving frequency and the driving voltage of the piezoelectric transformer based on the signal from the load output detection circuit 31 in FIG. 3 and FIG. 5, by handling it like a software by using a microcomputer or peripheral equipment such as a data storage device, e.g. memory.

In addition, in the first and second embodiments, as the driving frequency and the driving voltage of the piezoelectric transformer, the switching from the voltage having the first frequency and the first amplitude to the voltage having the second frequency and the second amplitude was performed by detecting that the impedance change of the load reached a predetermined value. However, as an alternative method, according to the characteristics of the piezoelectric transformer, this switching may be performed by detecting that the elapsed time from the moment when the power supply for the load started reaches a predetermined value.

Third Embodiment

Figure 8:
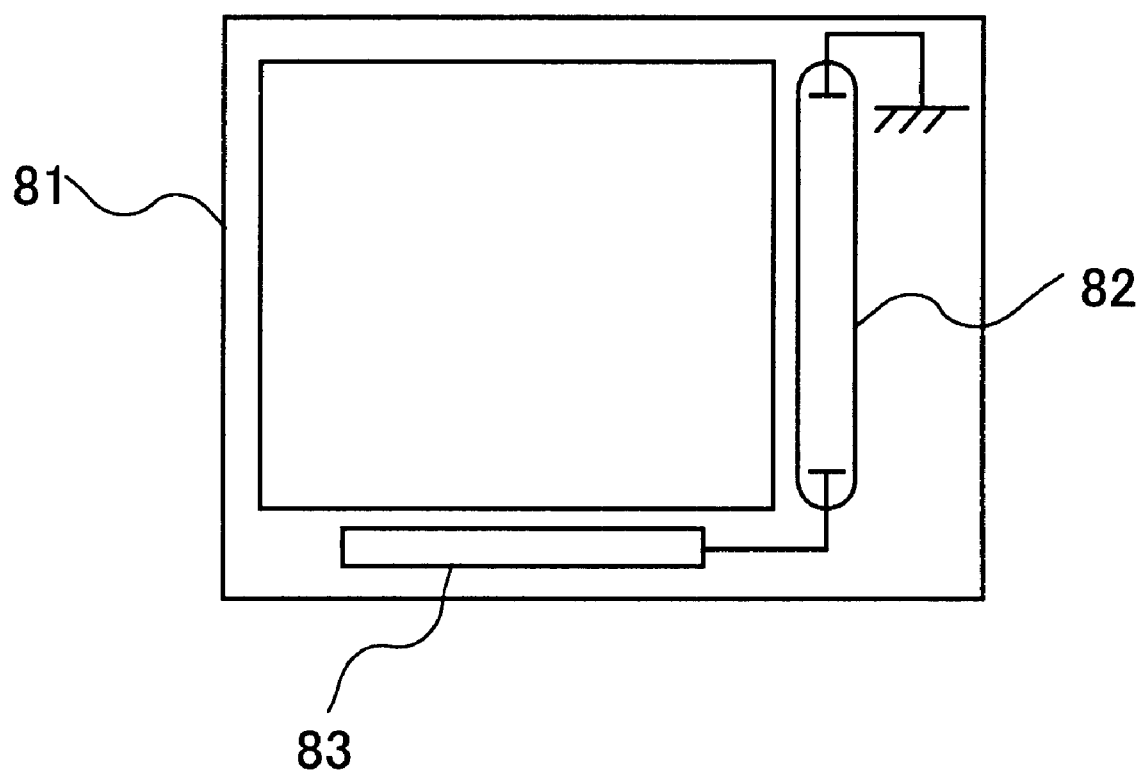
FIG. 8 is a schematic view showing an internal configuration of a liquid crystal panel according to a third embodiment of the present invention.

As a third embodiment of the present invention, FIG. 8 shows an internal configuration of an example in which the driving circuit of the piezoelectric transformer according to the first embodiment or the second embodiment is used as an inverter circuit for driving a cold cathode tube serving as a back light for a liquid crystal panel such as a liquid crystal display, a liquid crystal monitor etc. In FIG. 8, 81 is a liquid crystal panel, 82 is a cold cathode tube, and 83 is an inverter circuit.

In a conventional electromagnetic system transformer, it was necessary to output a high voltage required constantly at the time when a cold cathode tube started to light. However, by using a piezoelectric transformer, an output voltage of the piezoelectric transformer changes according to a load fluctuation at the time when the cold cathode tube starts to light or is lighting, so that negative effects on other circuit systems mounted on a liquid panel can be eliminated. Furthermore, since an output voltage sent to the cold cathode tube is almost sinusoidal, it is also possible to reduce unnecessary frequency components that do not contribute to the lighting of the cold cathode tube.

Furthermore, a piezoelectric transformer can handle larger electric energy per unit volume than an electromagnetic transformer can, so that the volume can be reduced. In addition, a piezoelectric transformer uses a length vibration of a rectangular plate, and due to its shape, it is advantageous to a production of a thinner transformer. As a result, a piezoelectric transformer can be mounted on a narrow place such as an edge of a liquid crystal panel, which also leads to miniaturization and reduced weight of the liquid crystal panel itself.

Fourth Embodiment

Figure 9:
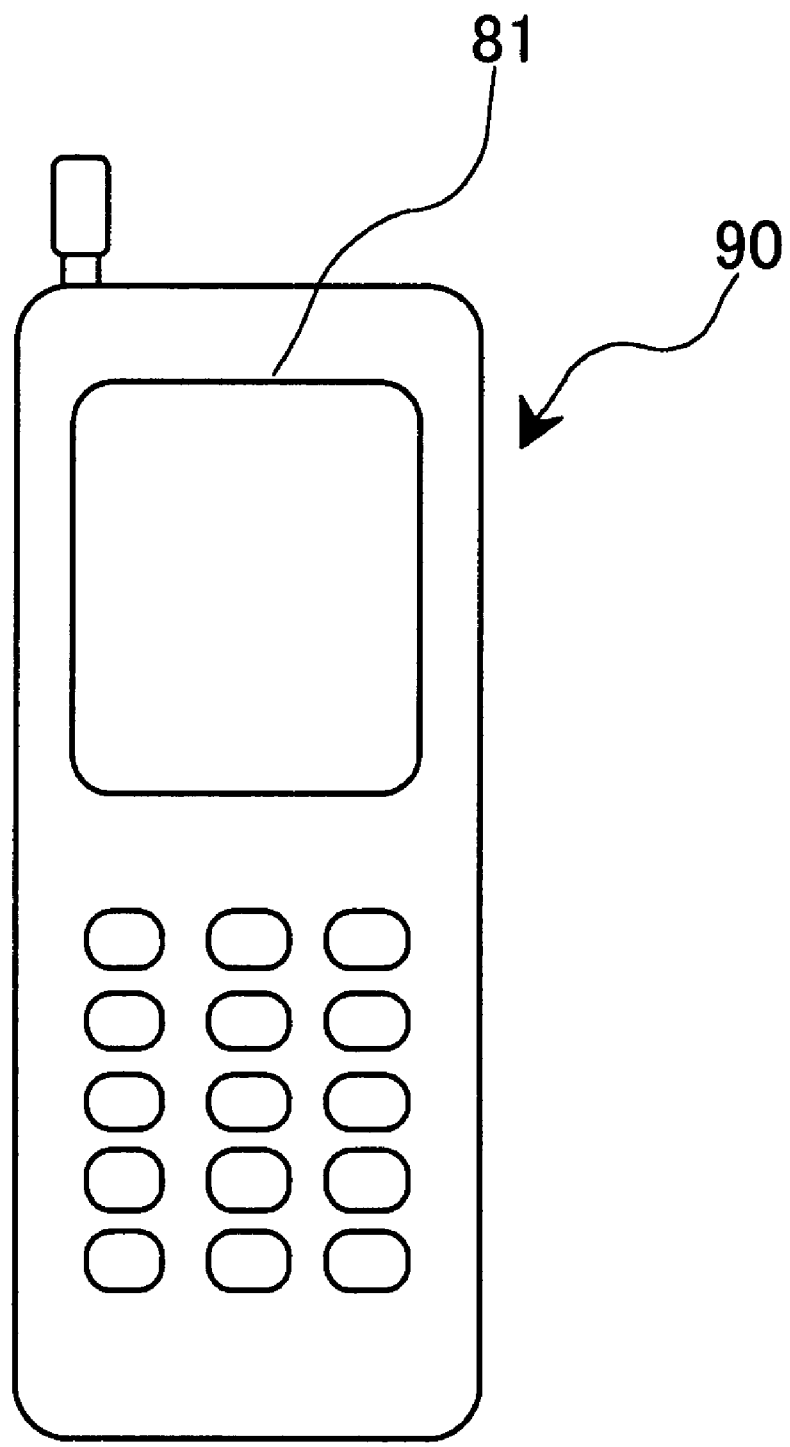
FIG. 9 is a plan view showing a schematic configuration of a mobile telephone according to a fourth embodiment of the present invention.

As a fourth embodiment of the present invention, FIG. 9 shows an external configuration of an example in which the liquid crystal panel according to the third embodiment is mounted on a mobile telephone. By mounting the liquid crystal panel according to the third embodiment, i.e. the liquid crystal panel 81 with a built-in driving circuit of the piezoelectric transformer according to the first embodiment or the second embodiment on an apparatus, for example, a mobile telephone 90, the driving frequency is not swept when lighting the cold cathode tube, so that the problems in the conventional technique of negative effects on the apparatus caused by noise or a cross modulation can be eliminated.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for driving a piezoelectric transformer having a primary side electrode and a secondary side electrode formed on a piezoelectric element, in which an AC voltage entering from the primary side electrode is converted and output from the secondary side electrode, the method for driving the piezoelectric transformer comprising:

driving the piezoelectric transformer with a predetermined first frequency in the vicinity of which a maximum driving efficiency is obtained, starting a power supply and coupling the power supply to a load connected to the secondary side of the piezoelectric transformer, and changing the driving frequency of the piezoelectric transformer from the first frequency without a sweep to a predetermined second frequency in the vicinity of which a maximum driving efficiency is obtained and driving the piezoelectric transformer when an impedance of the load changes and reaches a predetermined impedance after starting the power supply.

2. The method for driving a piezoelectric transformer according to claim 1, wherein the load is a cold cathode tube.

3. The method for driving a piezoelectric transformer according to claim 1, wherein the driving control of the piezoelectric transformer is performed by using a microcomputer and its peripheral equipment.

4. A method for driving a piezoelectric transformer having a primary side electrode and a secondary side electrode formed on a piezoelectric element, in which an AC voltage entering from the primary side electrode is converted and output from the secondary side electrode, the method for driving the piezoelectric transformer comprising:

supplying the load with a second electric power that is sufficiently smaller than a first electric power to detect characteristics of the piezoelectric transformer before supplying a first electric power steadily to a load connected t o the piezoelectric transformer, setting a driving frequency of the piezoelectric transformer for the time when the first electric power is supplied steadily, starting a power supply and coupling the power supply to the load connected to the secondary side of the piezoelectric transformer by driving the piezoelectric transformer with a first frequency and the first electric power, and changing the driving frequency of the piezoelectric transformer from the first frequency without a sweep to a predetermined second frequency and driving the piezoelectric transformer when an impedance of the load changes and reaches a predetermined impedance after starting the power supply.

5. The method for driving a piezoelectric transformer according to claim 4, wherein the load changes from a high impedance state to a low impedance state according to an increase of the amount of electricity to be supplied, and the first electric power has a level needed to change the load to be in a low impedance state, and the second electric power has only a level to keep the load in a high impedance.

6. The method for driving a piezoelectric transformer according to claim 4, wherein the piezoelectric transformer is driven with a first frequency when starting a power supply for the load, and the piezoelectric transformer is driven by changing the driving frequency without a sweep to a second frequency when supplying the load steadily with electric power.

7. The method for driving a piezoelectric transformer according to claim 4, wherein the load is a cold cathode tube.

8. The method for driving a piezoelectric transformer according to claim 4, wherein the driving control of the piezoelectric transformer is performed by using a microcomputer and its peripheral equipment.

9. A method for driving a piezoelectric transformer having a primary side electrode and a secondary side electrode formed on a piezoelectric element, in which an AC voltage entering from the primary side electrode is converted and output from the secondary side electrode, the method for driving the piezoelectric transformer comprising:
  classifying the piezoelectric transformer in advance by a certain characteristic parameter,
  driving the piezoelectric transformer with a predetermined first frequency and determining a second frequency by assuming characteristics of the piezoelectric transformer based on the result of driving the piezoelectric transformer with predetermined first frequency and on the result of classification by the characteristic parameter,
  starting a power supply and coupling the power supply to a load connected to the secondary side of the piezoelectric transformer by outputting a stepped-up or stepped-down power from the secondary side electrode by supplying an electric power to the primary side electrode, and
  when an impedance of the load changes and reaches a predetermined impedance during the power supply, changing the driving frequency of the piezoelectric transformer from the first frequency without a sweep to the second frequency and driving the piezoelectric transformer.

10. The method for driving a piezoelectric transformer according to claim 9, comprising: classifying the piezoelectric transformer by the certain characteristic parameter and also classifying the load by the same characteristic parameter or another characteristic parameter, and determining the second frequency based on the result of classifying the piezoelectric transformer and the result of classifying the load.

11. The method for driving a piezoelectric transformer according to claim 9, wherein the load is a cold cathode tube.

12. The method for driving a piezoelectric transformer according to claim 9, wherein the driving control of the piezoelectric transformer is performed by using a microcomputer and its peripheral equipment.

13. A driving circuit of a piezoelectric transformer comprising:
  a piezoelectric transformer having a primary side electrode and a secondary side electrode formed on a piezoelectric element, in which an AC voltage entering from the primary side electrode is converted and output from the secondary side electrode,
  a load coupled ed to the secondary side electrode of the piezoelectric transformer,
  a load output detect ion member for detecting an impedance of the load, and
  a control member for performing a driving control of the piezoelectric transformer with a first frequency and a supply power when an output from the load output d detection member is more than or equal to a predetermined value and changing the driving frequency from the first frequency to a second frequency without a sweep when the output from the load output detection member is less than the predetermined value.

14. The driving circuit of a piezoelectric transformer according to claim 13, wherein the load is a cold cathode tube.

15. The driving circuit of a piezoelectric transformer according to claim 13, wherein the control part includes a microcomputer and its peripheral equipment.

16. A driving circuit of a piezoelectric transformer comprising:
  a piezoelectric transformer having a primary side electrode and a secondary side electrode formed on a piezoelectric element, in which an AC voltage entering from the primary side electrode is converted and output from the secondary side electrode,
  a load connected to the secondary side electrode of the piezoelectric transformer,
  a load output detection member for detecting an impedance of the load,
  a transformer characteristic detection member for detecting characteristics of the piezoelectric transformer, and
  a control member for performing a driving control of the piezoelectric transformer with a second electric power that is sufficiently smaller than a first electric power before supplying the load steadily with the first electric power, and based on the characteristics of the piezoelectric transformer detected by the transformer characteristic detection member, performing a setting control of a driving frequency of the piezoelectric transformer according to the result of detection by the load output detection member when the first electric power is supplied steadily.

17. The driving circuit of a piezoelectric transformer according to claim 16, wherein the load changes from a high impedance state to a low impedance state according to an increase of the amount of electricity to be supplied, and the first electric power has a level needed to change the load to be in a low impedance state, and the second electric power has only a level to keep the load in a high impedance.

18. The driving circuit of a piezoelectric transformer according to claim 16, wherein the control part performs the driving control of the piezoelectric transformer with a first frequency when starting a power supply for the load and performs the driving control of the piezoelectric transformer by changing the driving frequency without a sweep to a second frequency according to the result of detection by the load output detection part when supplying the load steadily with electric power.

19. The driving circuit of a piezoelectric transformer according to claim 16, wherein the load is a cold cathode tube.

20. The driving circuit of a piezoelectric transformer according to claim 16, wherein the control part includes a microcomputer and its peripheral equipment.

21. A driving circuit of a piezoelectric transformer comprising:
  a piezoelectric transformer having a primary side electrode and a secondary side electrode formed on a piezoelectric element, in which an AC voltage entering from the primary side electrode is converted and output from the secondary side electrode,
  a load connected to the secondary side electrode of the piezoelectric transformer,
  a load output detection member for detecting an impedance of the load,
  a transformer characteristic detection member for detecting characteristics of the piezoelectric transformer, and
  a control member for determining a second frequency by assuming characteristics of the piezoelectric transformer classified in advance by a certain characteristic parameter, based on the result of classification by the characteristic parameter and the result of detection by the transformer characteristic detection member at the time when the piezoelectric transformer is driven with a predetermined first frequency, and setting a driving frequency of the piezoelectric transformer as the first frequency when starting a power supply for the load and changing the driving frequency from the first frequency to the second frequency without a sweep according to the result of detection by the load output detection member.

22. The driving circuit of a piezoelectric transformer according to claim 21, wherein the load is classified by the characteristic parameter or by another characteristic parameter, and the control part determines the second frequency based on the results of classifying the piezoelectric transformer and the load.

23. The driving circuit of a piezoelectric transformer according to claim 21, wherein the load is a cold cathode tube.

24. The driving circuit of a piezoelectric transformer according to claim 11, wherein the control part includes a microcomputer and its peripheral equipment.

25. A cold cathode tube emission device comprising:
a piezoelectric transformer having a primary side electrode and a secondary side electrode formed on a piezoelectric element, in which an AC voltage entering from the primary side electrode is converted and output from the secondary side electrode,
a cold cathode tube connected to the secondary side of the piezoelectric transformer,
a cold cathode tube output detection member for detecting an impedance of the cold cathode tube, and
a control member for performing a driving control of the piezoelectric transformer with a first frequency and a supply power when an output from the cold cathode tube output detection member is more than or equal to a predetermined value and changing the driving frequency from the first frequency to a second frequency without a sweep when the output from the cold cathode tube output detection member is less than the predetermined value.

26. A cold cathode tube emission device comprising:
a piezoelectric transformer having a primary side electrode and a secondary side electrode formed on a piezoelectric element, in which an AC voltage entering from the primary side electrode is converted and output from the secondary side electrode,
a cold cathode tube connected to the secondary side of the piezoelectric transformer,
a cold cathode tube output detection member for detecting an impedance of the cold cathode tube,
a transformer characteristic detection member for detecting characteristics of the piezoelectric transformer, and
a control member for performing a driving control of the piezoelectric transformer with a second electric power having a level of not lighting the cold cathode tube before supplying the cold cathode tube steadily with a first electric power, and based on the characteristics of the piezoelectric transformer detected by the transformer characteristic detection member, and performing a setting control of a driving frequency of the piezoelectric transformer according to the result of detection by the cold cathode tube output detection member when the first electric power is supplied steadily.

27. A cold cathode tube emission device comprising:
a piezoelectric transformer having a primary side electrode and a secondary side electrode formed on a piezoelectric element, in which an AC voltage entering from the primary side electrode is converted and output from the secondary side electrode,
a cold cathode tube connected to the secondary side of the piezoelectric transformer,
a cold cathode tube output detection member for detecting an impedance of the cold cathode tube,
a transformer characteristic detection member for detecting characteristics of the piezoelectric transformer, and
a control member for determining a second frequency by assuming characteristics of the piezoelectric transformer classified in advance by a certain characteristic parameter, based on the result of classification by the characteristic parameter and the result of detection by the transformer characteristic detection member when driving the piezoelectric transformer with a predetermined first frequency, and setting a driving frequency of the piezoelectric transformer as the first frequency when starting a power supply for the cold cathode tube and changing the driving frequency from the first frequency to the second frequency without a sweep according to the result of detection by the cold cathode tube output detection member.

28. A liquid crystal panel whose luminance is controlled by a built-in cold cathode tube emission device, the cold cathode tube emission device comprising:
a piezoelectric transformer having a primary side electrode and a secondary side electrode formed on a piezoelectric element, in which an AC voltage entering from the primary side electrode is converted and output from the secondary side electrode,
a cold cathode tube connected to the secondary side of the piezoelectric transformer,
a cold cathode tube output detection member for detecting an impedance of the cold cathode tube, and
a control member for performing a driving control of the piezoelectric transformer with a first frequency and a supply power when an output from the cold cathode tube output detection member is more than or equal to a predetermined value and changing the driving frequency from the first frequency to a second frequency without a sweep when the output from the cold cathode tube output detection member is less than the predetermined value.

29. A liquid crystal panel whose luminance is controlled by a built-in cold cathode tube emission device, the cold cathode tube emission device comprising:
a piezoelectric transformer having a primary side electrode and a secondary side electrode formed on a piezoelectric element, in which an AC voltage entering from the primary side electrode is converted and output from the secondary side electrode,
a cold cathode tube connected to the secondary side of the piezoelectric transformer,
a cold cathode tube output detection member for detecting an impedance of the cold cathode tube,
a transformer characteristic detection member for detecting characteristics of the piezoelectric transformer, and
a control member for performing a driving control of the piezoelectric transformer with a second electric power having a level of not lighting the cold cathode tube before supplying the cold cathode tube steadily with a first electric power, and based on the characteristics of the piezoelectric transformer detected by the transformer characteristic detection member, performing a setting control of a driving frequency of the piezoelectric transformer according to the result of detection by the cold cathode tube output detection member when the first electric power is supplied steadily.

30. A liquid crystal panel whose luminance is controlled by a built-in cold cathode tube emission device, the cold cathode tube emission device comprising:

a piezoelectric transformer having a primary side electrode and a secondary side electrode formed on a piezoelectric element, in which an AC voltage entering from the primary side electrode is converted and output from the secondary side electrode, a cold cathode tube connected to the secondary side of the piezoelectric transformer, a cold cathode tube output detection member for detecting an impedance of the cold cathode tube, a transformer characteristic detection member for detecting characteristics of the piezoelectric transformer, and a control member for determining a second frequency by assuming characteristics of the piezoelectric transformer classified in advance by a certain characteristic parameter, based on the result of classification by the characteristic parameter and the result of detection by the transformer characteristic detection member when driving the piezoelectric transformer with a predetermined first frequency, and setting a driving frequency of the piezoelectric transformer as the first frequency when starting a power supply for the cold cathode tube and changing the driving frequency from the first frequency to a second frequency without a sweep according to the result of detection by the cold cathode tube output detection member.

31. An apparatus provided with a liquid crystal panel whose luminance is controlled by a built-in cold cathode tube emission device, the cold cathode tube emission device comprising:

a piezoelectric transformer having a primary side electrode and a secondary side electrode formed on a piezoelectric element, in which an AC voltage entering from the primary side electrode is converted and output from the secondary side electrode, a cold cathode tube connected to the secondary side of the piezoelectric transformer, a cold cathode tube output detection member for detecting an impedance of the cold cathode tube, and a control member for performing a driving control of the piezoelectric transformer with a first frequency and a supply power when an output from the cold cathode tube output detection member is more than or equal to a predetermined value and changing the driving frequency from the first frequency to a second frequency without a sweep when the output from the cold cathode tube output detection member is less than the predetermined value.

32. An apparatus provided with a liquid crystal panel whose luminance is controlled by a built-in cold cathode tube emission device, the cold cathode tube emission device comprising:

a piezoelectric transformer having a primary side electrode and a secondary side electrode formed on a piezoelectric element, in which an AC voltage entering from the primary side electrode is converted and output from the secondary side electrode, a cold cathode tube connected to the secondary side of the piezoelectric transformer, a cold cathode tube output detection member for detecting an impedance of the cold cathode tube, a transformer characteristic detection member for detecting characteristics of the piezoelectric transformer, and a control member for performing a driving control of the piezoelectric transformer with a second electric power having a level of not lighting the cold cathode tube before supplying the cold cathode tube steadily with a first electric power, and based on the characteristics of the piezoelectric transformer detected by the transformer characteristic detection member, performing a setting control of a driving frequency of the piezoelectric transformer according to the result of detection by the cold cathode tube output detection member when the first electric power is supplied steadily.

33. An apparatus provided with a liquid crystal panel whose luminance is controlled by a built-in cold cathode tube emission device, the cold cathode tube emission device comprising:

a piezoelectric transformer having a primary side electrode and a secondary side electrode formed on a piezoelectric element, in which an AC voltage entering from the primary side electrode is converted and output from the secondary side electrode, a cold cathode tube connected to the secondary side of the piezoelectric transformer, a cold cathode tube output detection member for detecting an impedance of the cold cathode tube, a transformer characteristic detection member for detecting characteristics of the piezoelectric transformer, and a control member for determining a second frequency by assuming characteristics of the piezoelectric transformer classified in advance by a certain characteristic parameter, based on the result of classification by the characteristic parameter and the result of detection by the transformer characteristic detection member when driving the piezoelectric transformer with a predetermined first frequency, and setting a driving frequency of the piezoelectric transformer as the first frequency when starting a power supply for the cold cathode tube and changing the driving frequency from the first frequency to the second frequency without a sweep according to the result of detection by the cold cathode tube output detection member.

34. A method for driving a piezoelectric transformer having a primary side electrode and a secondary side electrode formed on a piezoelectric element, in which an AC voltage entering from the primary side electrode is converted and output from the secondary side electrode, the method for driving the piezoelectric transformer comprising:

driving the piezoelectric transformer with a predetermined first frequency in the vicinity of which a maximum voltage step-up ratio is obtained, starting a power supply and coupling the power supply to a load connected to the secondary side of the piezoelectric transformer, and changing the driving frequency of the piezoelectric transformer from the first frequency without a sweep to a predetermined second frequency in the vicinity of which a maximum voltage step-up ratio is obtained and driving the piezoelectric transformer when an impedance of the load changes and reaches a predetermined impedance after starting the power supply.

35. A method for driving a piezoelectric transformer having a primary side electrode and a secondary side electrode formed on a piezoelectric element, in which an AC voltage entering from the primary side electrode is converted and output from the secondary side electrode, the method for driving the piezoelectric transformer comprising:

driving the piezoelectric transformer with a predetermined first frequency in the vicinity of which a maximum voltage step-up ratio is obtained, starting a power supply and coupling the power supply to a load connected to the secondary side of the piezoelectric transformer, and changing the driving frequency of the piezoelectric transformer from the first frequency without a sweep to a predetermined second frequency in the vicinity of which a maximum driving efficiency is obtained and driving the piezoelectric transformer when an impedance of the load changes and reaches a predetermined impedance after starting the power supply.

36. A method for driving a piezoelectric transformer having a primary side electrode and a secondary side electrode formed on a piezoelectric element, in which an AC voltage entering from the primary side electrode is converted and output from the secondary side electrode, the method for driving the piezoelectric transformer comprising:

driving the piezoelectric transformer with a predetermined first frequency in the vicinity of which a maximum driving efficiency is obtained, starting a power supply and coupling the power supply to a load connected to the secondary side of the piezoelectric transformer, and changing the driving frequency of the piezoelectric transformer from the first frequency without a sweep to a predetermined second frequency in the vicinity of which a maximum voltage step-up ratio is obtained and driving the piezoelectric transformer when an impedance of the load changes and reaches a predetermined impedance after starting the power supply.

37. The method for driving a piezoelectric transformer according to claim 4, wherein the characteristics of the piezoelectric transformer to be detected include frequency characteristics of at least one selected from a voltage step-up ratio, a driving efficiency, a phase difference between input and output voltages, an input impedance, and a phase difference between an input voltage and an input current.

38. The method for driving a piezoelectric transformer according to claim 9, wherein the characteristic parameter includes frequency characteristics of at least one selected from a voltage step-up ratio, a driving efficiency, a phase difference between input and output voltages, an input impedance, and a phase difference between an input voltage and an input current.

39. A driving circuit of a piezoelectric transformer comprising:

a piezoelectric transformer having a primary side electrode and a secondary side electrode formed on a piezoelectric element, in which an AC voltage entering from the primary side electrode is converted and output from the secondary side electrode, a load coupled to the secondary side electrode of the piezoelectric transformer, a load output detection member for detecting an impedance of the load, and a control member for performing a driving control of the piezoelectric transformer with a first frequency and a supply power when an output from the load output detection member is less than or equal to a predetermined value and changing the driving frequency from the first frequency to a second frequency without a sweep when the output from the load output detection member is more than the predetermined value.

40. The driving circuit of a piezoelectric transformer according to claim 16, wherein the characteristics of the piezoelectric transformer detected by the transformer characteristic detection member include frequency characteristics of at least one selected from a voltage step-up ratio, a driving efficiency, a phase difference between input and output voltages, an input impedance, and a phase difference between an input voltage and an input current.

41. The driving circuit of a piezoelectric transformer according to claim 21, wherein the characteristic parameter includes frequency characteristics of at least one selected from a voltage step-up ratio, a driving efficiency, a phase difference between input and output voltages, an input impedance, and a phase difference between an input voltage and an input current.

42. A cold cathode tube emission device comprising:

a piezoelectric transformer having a primary side electrode and a secondary side electrode formed on a piezoelectric element, in which an AC voltage entering from the primary side electrode is converted and output from the secondary side electrode, a cold cathode tube connected to the secondary side of the piezoelectric transformer, a cold cathode tube output detection member for detecting an impedance of the cold cathode tube, and a control member for performing a driving control of the piezoelectric transformer with a first frequency and a supply power when an output from the cold cathode tube output detection member is less than or equal to a predetermined value and changing the driving frequency from the first frequency to a second frequency without a sweep when the output from the cold cathode tube output detection member is more than the predetermined value.

43. The cold cathode tube emission device according to claim 26, wherein the characteristics of the piezoelectric transformer detected by the transformer characteristic detection member include frequency characteristics of at least one selected from a voltage step-up ratio, a driving efficiency, a phase difference between input and output voltages, an input impedance, and a phase difference between an input voltage and an input current.

44. The cold cathode tube emission device according to claim 27, wherein the characteristic parameter includes frequency characteristics of at least one selected from a voltage step-up ratio, a driving efficiency, a phase difference between input and output voltages, an input impedance, and a phase difference between an input voltage and an input current.

45. A liquid crystal panel whose luminance is controlled by a built-in cold cathode tube emission device, the cold cathode tube emission device comprising:

a piezoelectric transformer having a primary side electrode and a secondary side electrode formed on a piezoelectric element, in which an AC voltage entering from the primary side electrode is converted and output from the secondary side electrode, a cold cathode tube connected to the secondary side of the piezoelectric transformer, a cold cathode tube output detection member for detecting an impedance of the cold cathode tube, and a control member for performing a driving control of the piezoelectric transformer with a first frequency and a supply power when an output from the cold cathode tube output detection member is less than or equal to a predetermined value and changing the driving frequency from the first frequency to a second frequency without a sweep when the output from the cold cathode tube output detection member is more than the predetermined value.

46. The liquid crystal panel according to claim 29, wherein the characteristics of the piezoelectric transformer detected by the transformer characteristic detection member include frequency characteristics of at least one selected from a voltage step-up ratio, a driving efficiency, a phase difference between input and output voltages, an input impedance, and a phase difference between an input voltage and an input current.

47. The liquid crystal panel according to claim 30, wherein the characteristic parameter includes frequency characteristics of at least one selected from a voltage step-up ratio, a driving efficiency, a phase difference between input and output voltages, an input impedance, and a phase difference between an input voltage and an input current.

48. An apparatus provided with a liquid crystal panel whose luminance is controlled by a built-in cold cathode tube emission device, the cold cathode tube emission device comprising:

a piezoelectric transformer having a primary side electrode and a secondary side electrode formed on a piezoelectric element, in which an AC voltage entering from the primary side electrode is converted and output from the secondary side electrode, a cold cathode tube connected to the secondary side of the piezoelectric transformer, a cold cathode tube output detection member for detecting an impedance of the cold cathode tube, and a control member for performing a driving control of the piezoelectric transformer with a first frequency and a supply power when an output from the cold cathode tube output detection member is less than or equal to a predetermined value and changing the driving frequency from the first frequency to a second frequency without a sweep when the output from the cold cathode tube output detection member is more than the predetermined value.

49. The apparatus according to claim 32, wherein the characteristics of the piezoelectric transformer detected by the transformer characteristic detection member include frequency characteristics of at least one selected from a voltage step-up ratio, a driving efficiency, a phase difference between input and output voltages, an input impedance, and a phase difference between an input voltage and input current.

50. The apparatus according to claim 33, wherein the characteristic parameter includes frequency characteristics of at least one selected from a voltage step-up ratio, a driving efficiency, a phase difference between input and output voltages, an input impedance, and a phase difference between an input voltage and an input current.

* * * * *

UNITED STATES PATENT AND TRADEMARK OFFICE
CERTIFICATE OF CORRECTION

PATENT NO.   : 6,509,671 B2
DATED        : January 21, 2003
INVENTOR(S)  : Takeda et al.

It is certified that error appears in the above-identified patent and that said Letters Patent is hereby corrected as shown below:

Column 18,
Line 35, "connected t o" should read -- connected to --

Column 19,
Line 50, "coupled ed to" should read -- coupled to --
Line 52, "detect ion" should read -- detection --
Line 56, "output d detection" should read -- output detection --

Signed and Sealed this

Ninth Day of December, 2003

JAMES E. ROGAN
*Director of the United States Patent and Trademark Office*